(12) United States Patent
Yeh et al.

(10) Patent No.: US 11,855,213 B2
(45) Date of Patent: *Dec. 26, 2023

(54) FINFET DEVICE AND METHOD OF FORMING SAME

(71) Applicant: Taiwan Semiconductor Manufacturing Co., Ltd., Hsinchu (TW)

(72) Inventors: Hsin-Hao Yeh, Taipei (TW); Fu-Ting Yen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,770

(22) Filed: Apr. 4, 2022

(65) Prior Publication Data

US 2022/0231169 A1 Jul. 21, 2022

Related U.S. Application Data

(63) Continuation of application No. 16/421,744, filed on May 24, 2019, now Pat. No. 11,296,225.

(60) Provisional application No. 62/692,430, filed on Jun. 29, 2018.

(51) Int. Cl.
*H01L 29/78* (2006.01)
*H01L 21/762* (2006.01)
*H01L 29/66* (2006.01)
*H01L 21/324* (2006.01)

(52) U.S. Cl.
CPC ........ *H01L 29/7849* (2013.01); *H01L 21/324* (2013.01); *H01L 21/76224* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 7,399,663 B2 | 7/2008 | Hoentschel et al. |
| 8,361,847 B2 | 1/2013 | Johnson et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,496,362 B1 | 11/2016 | Alptekin et al. |

(Continued)

FOREIGN PATENT DOCUMENTS

| | | |
|---|---|---|
| CN | 102386226 A | 3/2012 |
| CN | 105810736 A | 7/2016 |

(Continued)

*Primary Examiner* — Sarah K Salerno
(74) *Attorney, Agent, or Firm* — Slater Matsil, LLP

(57) ABSTRACT

A method includes forming a fin over a substrate, forming a dummy gate structure over the fin, removing a portion of the fin adjacent the dummy gate structure to form a first recess, depositing a stressor material in the first recess, removing at least a portion of the stressor material from the first recess, and after removing the at least a portion of the stressor material, epitaxially growing a source/drain region in the first recess.

20 Claims, 36 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 9,825,157 B1 | 11/2017 | Jain et al. |
| 10,770,570 B2 | 9/2020 | Lin et al. |
| 10,937,906 B2 | 3/2021 | Tsai et al. |
| 2007/0194402 A1 | 8/2007 | Sandhu et al. |
| 2007/0267703 A1 | 11/2007 | Chong et al. |
| 2011/0291189 A1 | 12/2011 | Cheng et al. |
| 2012/0049249 A1 | 3/2012 | Zhu et al. |
| 2012/0070947 A1 | 3/2012 | Basker et al. |
| 2012/0104498 A1 | 5/2012 | Majumdar et al. |
| 2012/0223364 A1 | 9/2012 | Chung et al. |
| 2014/0154876 A1 | 6/2014 | Tsal et al. |
| 2014/0346600 A1 | 11/2014 | Cheng et al. |
| 2015/0255542 A1 | 9/2015 | Cai et al. |
| 2015/0295085 A1 | 10/2015 | Yu et al. |
| 2015/0303304 A1 | 10/2015 | Bao |
| 2015/0372100 A1 | 12/2015 | Zschatzch et al. |
| 2016/0163702 A1 | 6/2016 | Wu et al. |
| 2016/0204229 A1 | 7/2016 | Tsai et al. |
| 2016/0211371 A1 | 7/2016 | Tsai et al. |
| 2016/0379971 A1 | 12/2016 | Lin et al. |
| 2017/0154996 A1 | 6/2017 | Lin et al. |
| 2017/0207126 A1 | 7/2017 | Ching et al. |
| 2018/0366580 A1 | 12/2018 | Zhou |

FOREIGN PATENT DOCUMENTS

| | | |
|---|---|---|
| CN | 106981516 A | 7/2017 |
| CN | 108122776 A | 6/2018 |
| KR | 20080066834 A | 7/2008 |

FINFET DEVICE AND METHOD OF FORMING SAME

PRIORITY CLAIM AND CROSS-REFERENCE

This application is a continuation of U.S. patent application Ser. No. 16/421,744 filed May 24, 2019, now U.S. Pat. No. 11,296,225, entitled "FinFET Device and Method of Forming Same," which claims priority to U.S. Provisional Patent Application No. 62/692,430 filed Jun. 29, 2018, entitled "FinFET Device and Method of Forming Same," each application is hereby incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
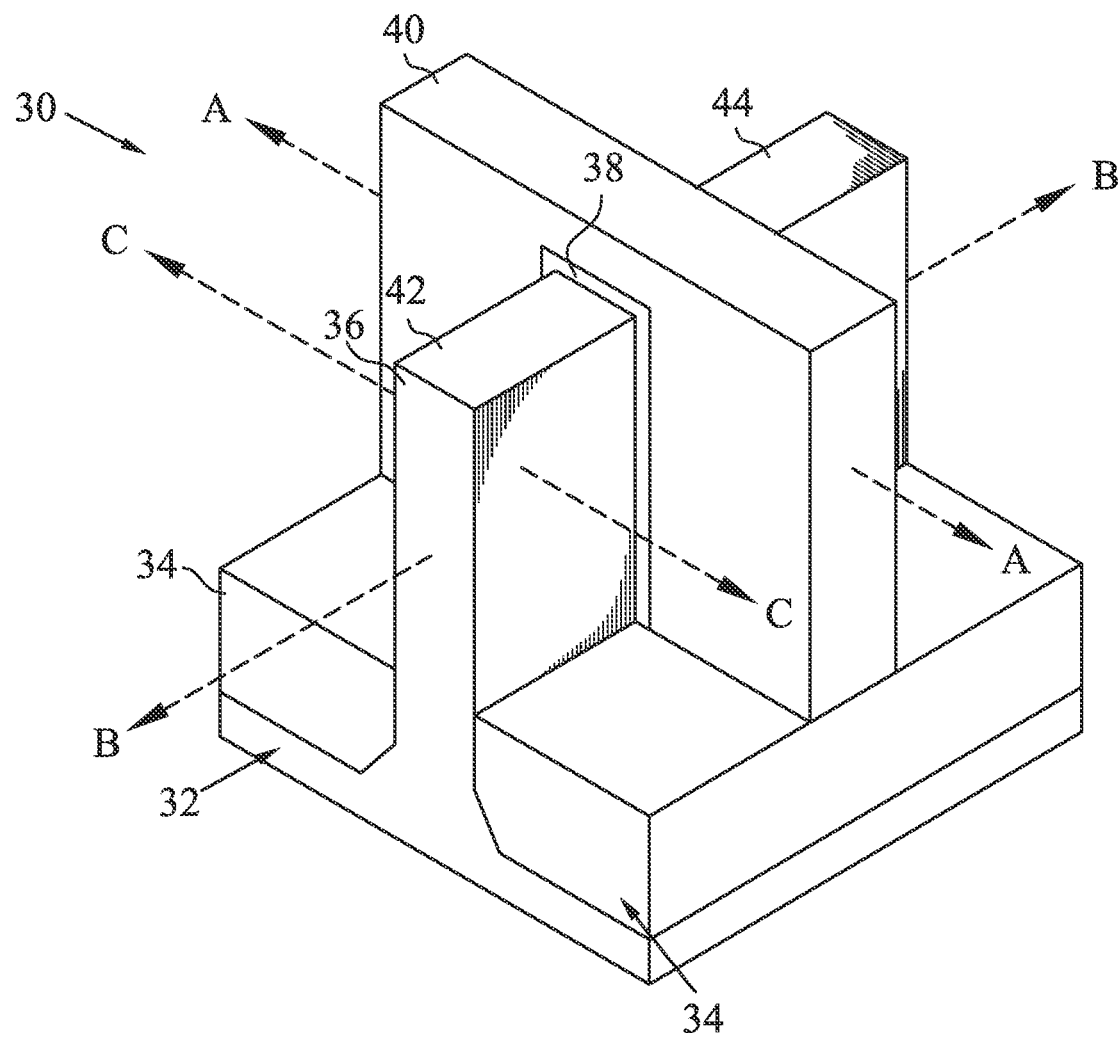
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for controlling the stresses imparted to a channel region of a FinFET device. Various embodiments presented herein are discussed in the context of FinFETs formed using a gate-last process. In other embodiments, a gate-first process may be used. The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins. Some embodiments contemplate aspects used in planar devices, such as planar FETs. Some embodiments may be used in a device such as a ring oscillator, or may be used in other types of devices. Some embodiments may also be used in semiconductor devices other than FETs.

FIG. 1 illustrates an example of a fin field-effect transistor (FinFET) 30 in a three-dimensional view. The FinFET 30 includes a fin 36 on a semiconductor substrate 32. The fin 36 protrudes above and from between neighboring isolation regions 34, which are disposed over portions of the semiconductor substrate 32. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross-section A-A and is across fin 36 outside of the channel (e.g., across the source/drain region 42). Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2 through 22C are cross-sectional views of intermediate stages in the manufacturing of FinFETs in accordance with some embodiment. In FIGS. 6A through 14A-C and FIGS. 17A-C through 26A-C, figures ending with an "A" designation are illustrated along the reference cross-section A-A illustrated in FIG. 1, except for multiple FinFETs and multiple fins per FinFET. Figures ending with a "B" designation are illustrated along the reference cross-section B-B illustrated in FIG. 1. Figures ending with a "C" designation are illustrated along the cross-section C-C illustrated in FIG. 1. FIGS. 2-5 are illustrated along the reference cross-section A-A illustrated in FIG. 1. FIGS. 15 and 16A-D are illustrated along the reference cross-section B-B illustrated in FIG. 1.

Figure 2:
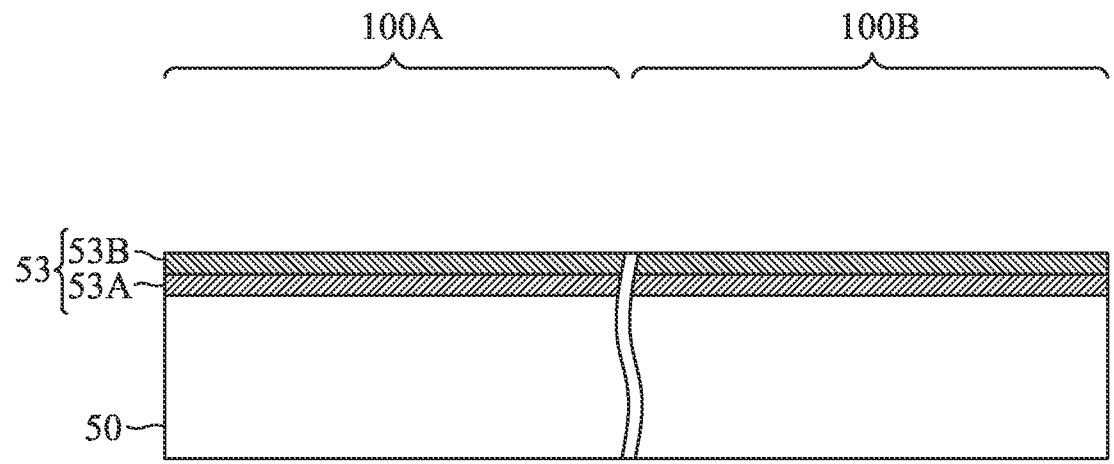
FIG. 2 is a cross-sectional view of an intermediate stage in the manufacture of a FinFET device in accordance with some embodiments.

FIG. 2 illustrates a substrate 50. FIG. 2 is illustrated along the reference cross-section A-A illustrated in FIG. 1. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof.

In some embodiments, the substrate 50 may include a first region 100A and a second region 100B. The first region 100A can be for forming N-type devices, such as NMOS transistors, such as N-type FinFETs. The second region 100B can be for forming P-type devices, such as PMOS transistors, such as P-type FinFETs. Accordingly, the first region 100A may be also referred to as an NMOS region 100A, and the second region 100B may be also referred to as a PMOS region 100B. In some embodiments, the first region 100A may be physically separated from the second region 100B. The first region 100A may be separated from the second region 100B by any number of features.

FIG. 2 further illustrates the formation of a mask 53 over the substrate 50. In some embodiments, the mask 53 may be used in a subsequent etching step to pattern the substrate 50 (See FIG. 3). As shown in FIG. 2, the mask 53 may include a first mask layer 53A and a second mask layer 53B. The first mask layer 53A may be a hard mask layer, may include silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may also include multiple layers, and the multiple layers may be different materials. For example, the first mask layer 53A may include a layer of silicon nitride over a layer of silicon oxide, though other materials and combinations of materials may also be used. The second mask layer 53B may include photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may include three or more mask layers.

Figure 3:
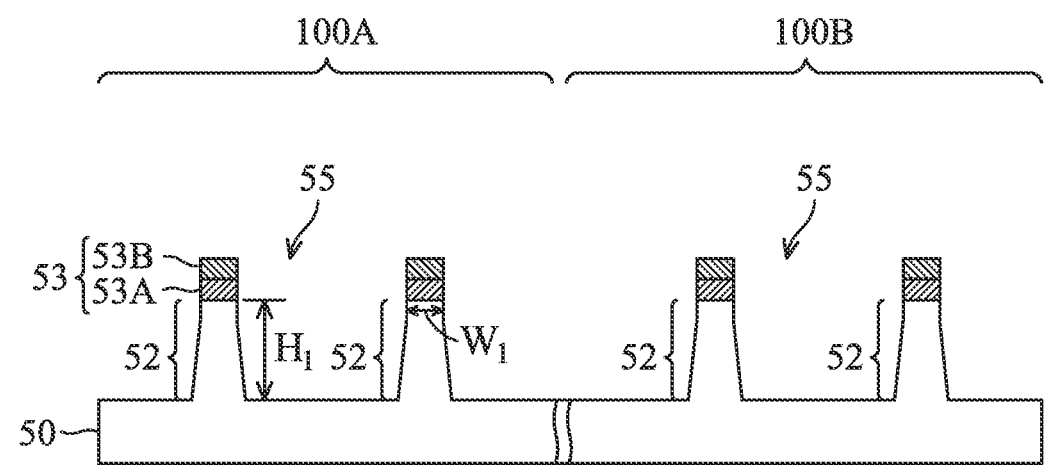
FIG. 3 is a cross-sectional view of an intermediate stage in the manufacture of a FinFET device in accordance with some embodiments.

FIG. 3 illustrates the formation of semiconductor strips 52 in the substrate 50. First, mask 53 may be patterned, where openings in first mask layer 53A and second mask layer 53B expose areas of the substrate 50 where Shallow Trench Isolation (STI) regions 54 will be formed (see FIG. 5). Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_1$ between about 100 nm and about 300 nm, and may have a width Wi between about 10 nm and about 40 nm.

Figure 4:
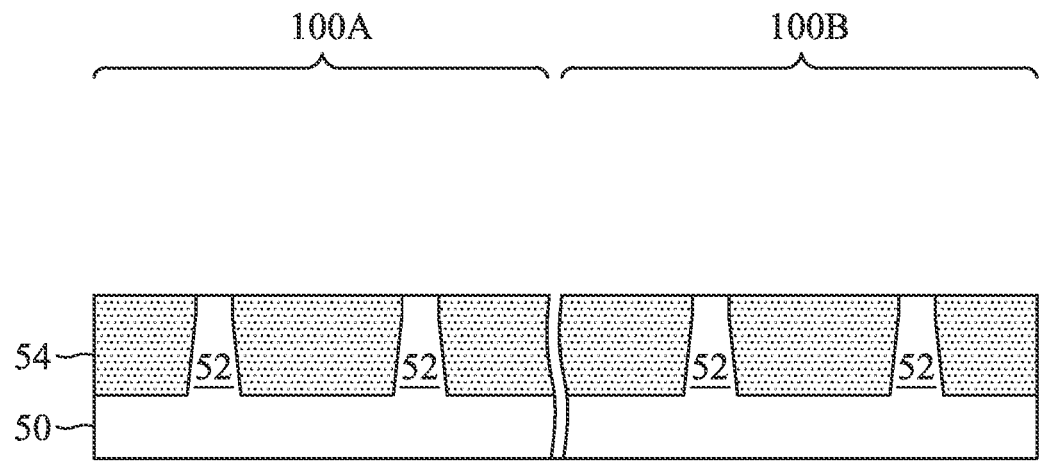
FIG. 4 is a cross-sectional view of an intermediate stage in the manufacture of a FinFET device in accordance with some embodiments.

FIG. 4 illustrates the formation of an insulation material in the trenches 55 (see FIG. 3) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and a bottom surface of the trenches 55 (see FIG. 3) prior to the filling of the trenches 55 with an insulation material of the isolation regions 54. In some embodiments, the liner may include a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable process, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments, the CMP may also remove the mask 53. In other embodiments, the mask 53 may be removed using a wet etching process separate from the CMP.

Figure 5:
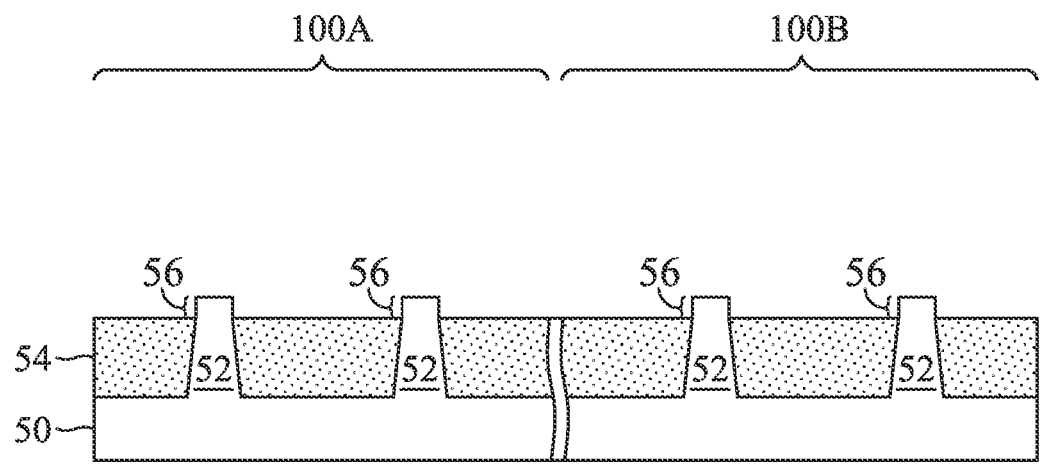
FIG. 5 is a cross-sectional view of an intermediate stage in the manufacture of a FinFET device in accordance with some embodiments.

FIG. 5 illustrates the recessing of the isolation regions 54 to form fins 56. The isolation regions 54 are recessed such that fins 56 in the first region 100A and in the second region 100B protrude from between neighboring isolation regions 54. In some embodiments, the semiconductor strips 52 may be considered to be part of the fins 56. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate process. The isolation regions 54 may be recessed using an acceptable etching process, such as one that is selective to the material of the isolation regions 54. For example, a STI oxide removal using a dilute hydrofluoric (dHF) acid or another type of etching process may be used.

A person having ordinary skill in the art will readily understand that the process described with respect to FIGS. 2 through 5 is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4 can be recessed, and a material different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
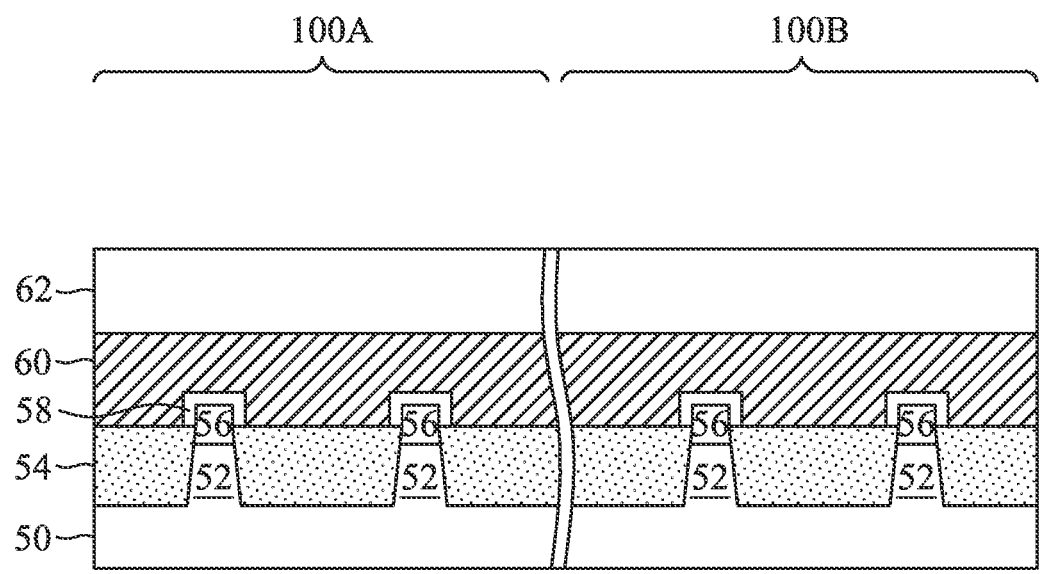
FIGS. 6A-B are cross-sectional views of intermediate stages in the manufacture of a FinFET device in accordance with some embodiments.
Figure 6B:
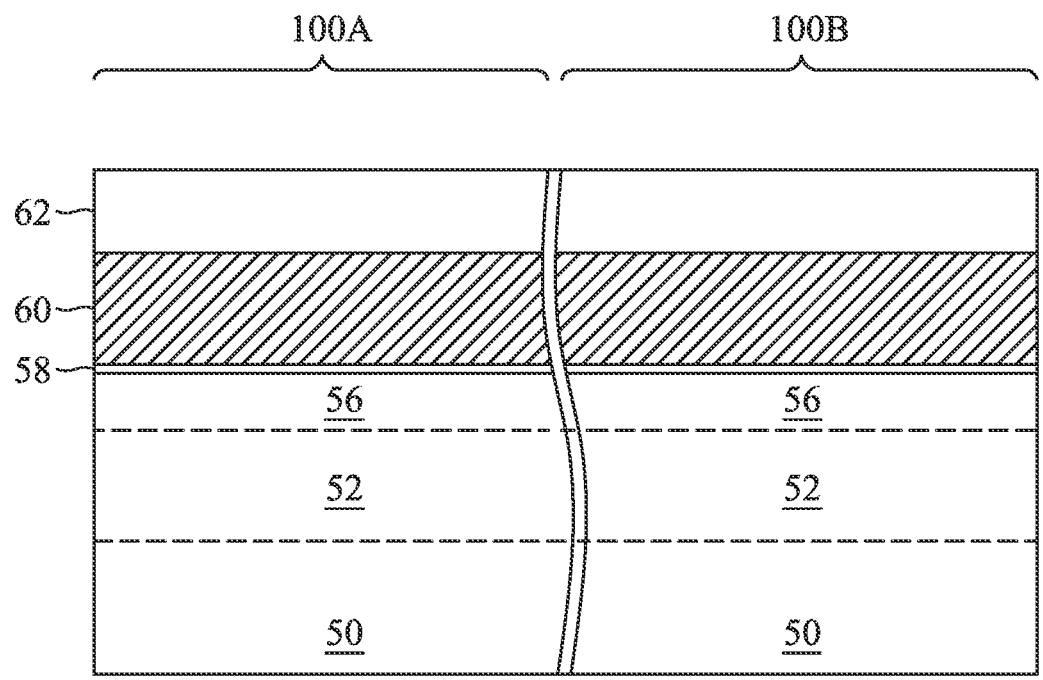

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. In some cases, the dummy dielectric layer 58 may be formed over the fins 56 and the isolation regions 54, and then portions of the dummy dielectric layer 58 formed over the isolation regions 54 are removed using suitable photolithographic or etching techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof.

Referring further to FIGS. 6A and 6B, in the illustrated embodiment, a single dummy dielectric layer 58, a single dummy gate layer 60, and a single mask 62 are each formed on both the first region 100A and the second region 100B in a single deposition step. In other embodiments, separate dummy dielectric layers, separate dummy gate layers, and separate masks may be formed in the first region 100A and the second region 100B in separate deposition steps for the first region 100A and for the second region 100B. In some embodiments, the dummy dielectric layer 58 may have a thickness between about 0.5 nm and about 3.0 nm, and the dummy gate layer 60 may have a thickness between about 50 nm and about 100 nm.

Figure 7A:
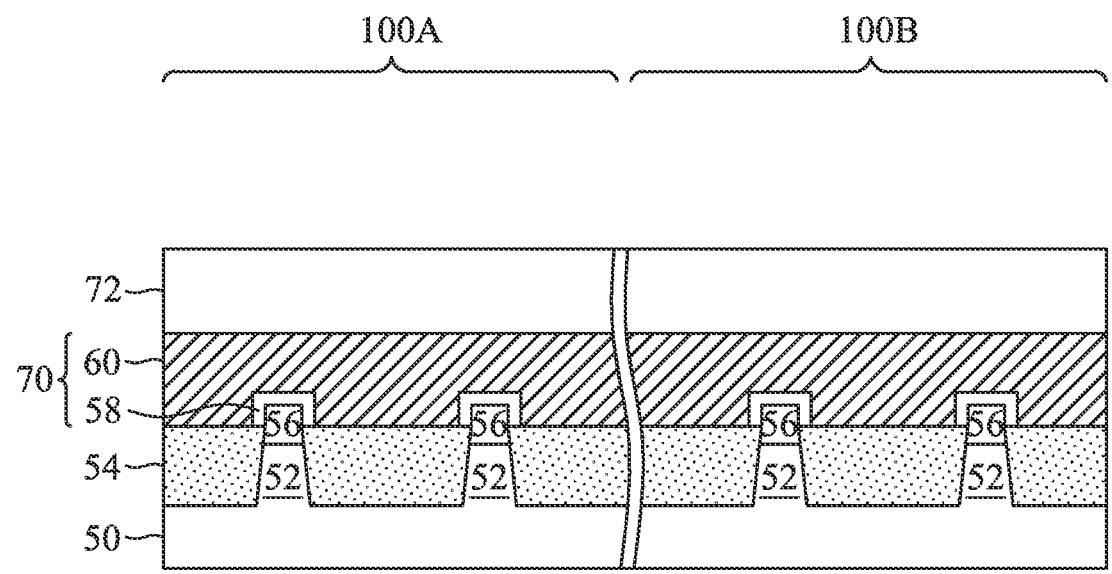
FIGS. 7A-C are cross-sectional views of intermediate stages in the manufacture of a FinFET device in accordance with some embodiments.
Figure 7B:
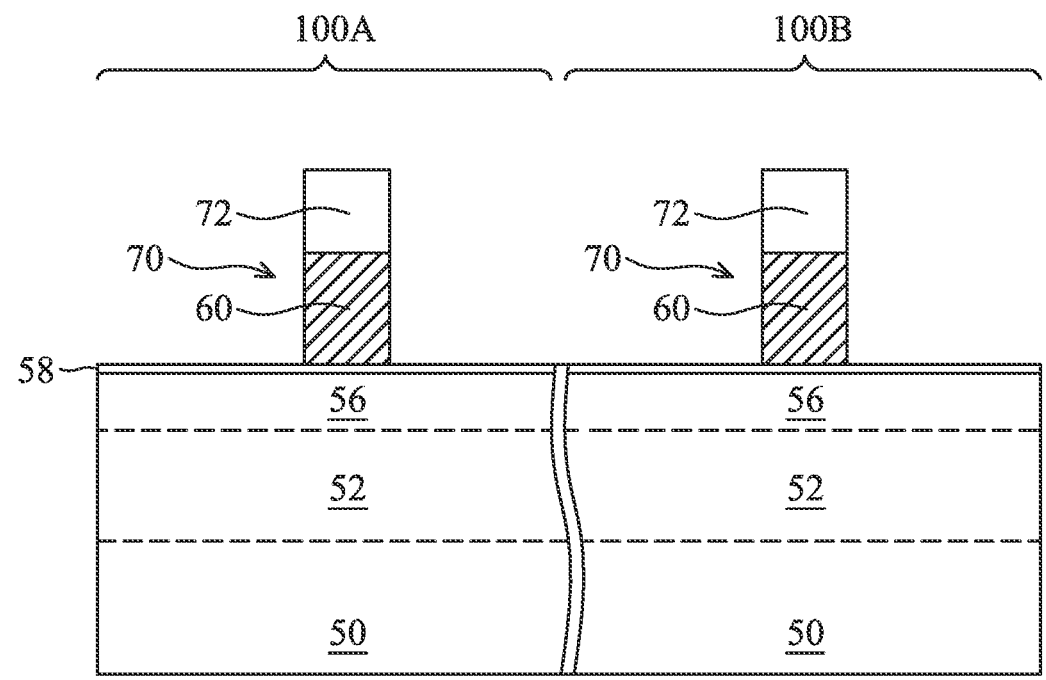
Figure 7C:
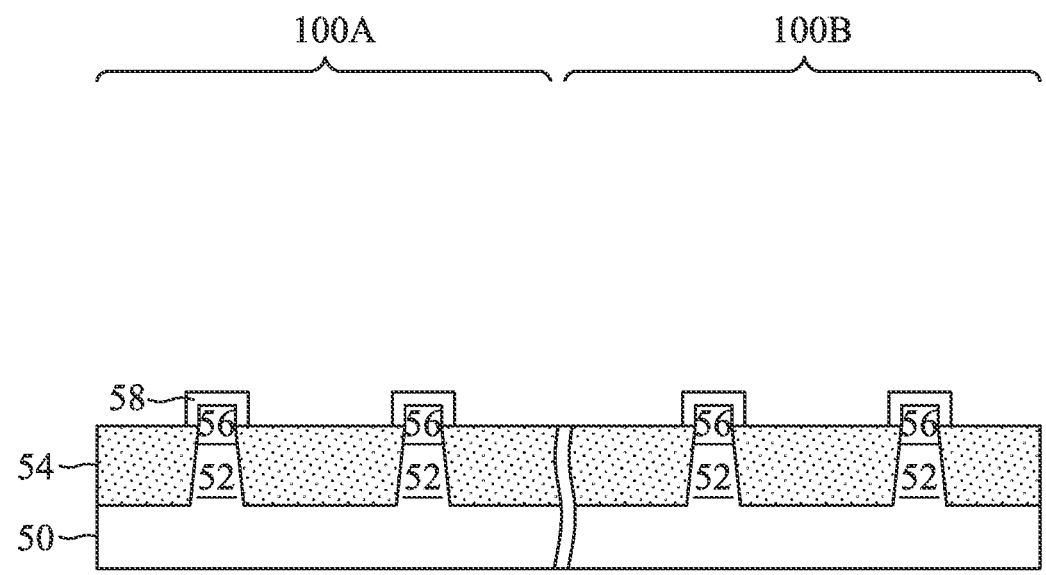

In FIGS. 7A-C, the mask 62 (see FIGS. 6A and 6B) may be patterned using acceptable photolithography and etching techniques to form a mask 72 in the first region 100A and in the second region 100B. The mask 72 may be a hardmask, and the pattern of the mask 72 may be different between the first region 100A and the second region 100B. The pattern of the mask 72 may be transferred to the dummy gate layer 60 by an acceptable etching technique to form dummy gate stack 70 in the first region 100A and in the second region 100B. The dummy gate stack 70 includes the dummy gate layer 60 and the dummy dielectric layer 58. In some embodiments, the dummy gate layer 60 and the mask 72 are formed in separate processes in the first region 100A and the second region 100B, and may be formed of different materials in the first region 100A and the second region 100B. Optionally, the pattern of the mask 72 may similarly be transferred to dummy dielectric layer 58. The pattern of the dummy gate stack 70 covers respective channel regions of the fins 56 while exposing source/drain regions of the fins 56. The dummy gate stack 70 may also have a lengthwise direction substantially perpendicular to the lengthwise direction of respective fins 56. A size of the dummy gate stack 70 or a pitch between dummy gate stacks 70 may depend on a region of a die in which the dummy gates are formed. In some embodiments, dummy gate stacks 70 may have a larger size or a larger pitch when located in an input/output region of a die (e.g., where input/output circuitry is disposed) than when located in a logic region of a die (e.g., where logic circuitry is disposed). In some embodiments, the dummy gate stacks 70 may have a width between about 10 nm and about 40 nm.

Figure 8A:
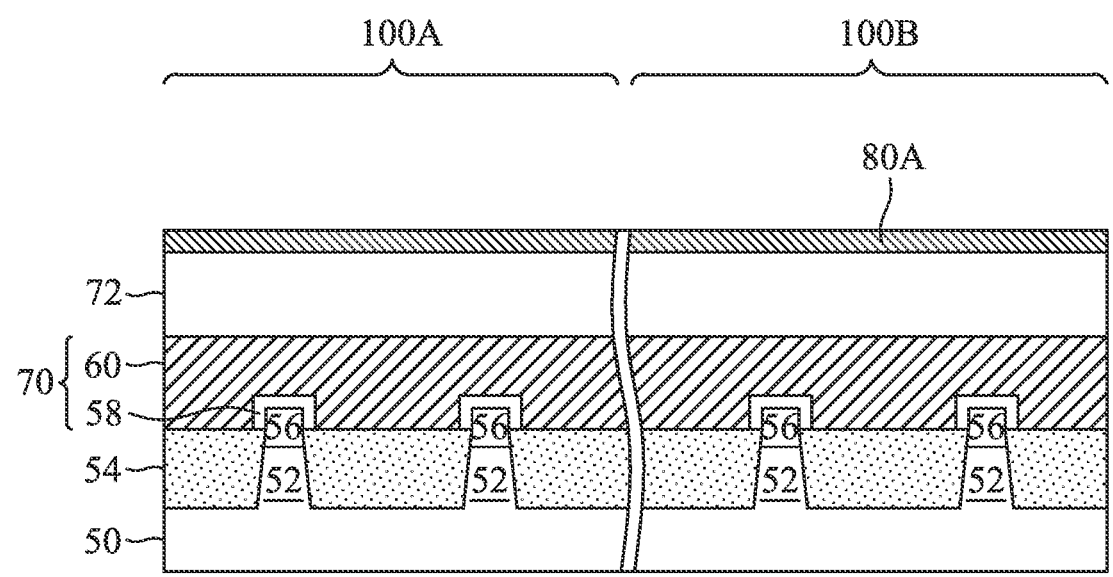
FIGS. 8A-C are cross-sectional views of intermediate stages in the manufacture of a FinFET device in accordance with some embodiments.
Figure 8B:
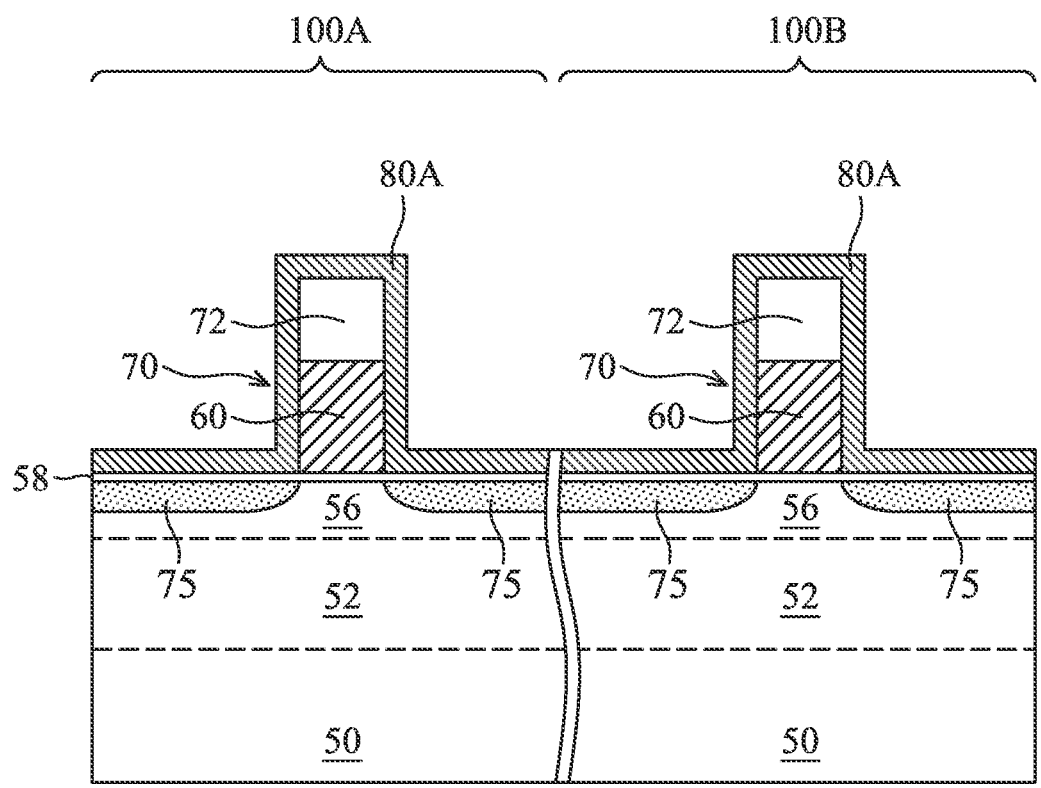
Figure 8C:
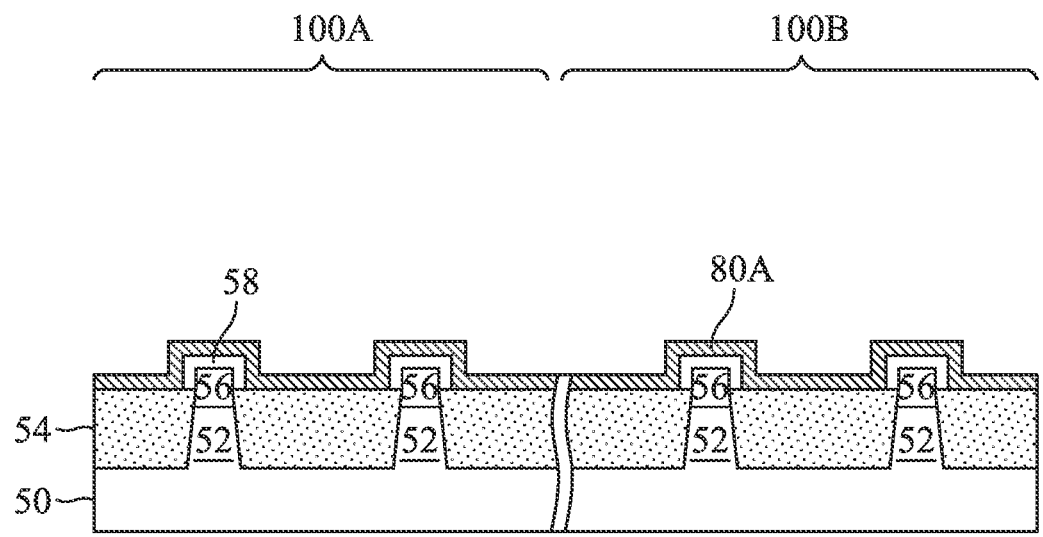

In FIGS. 8A-C, a first spacer layer 80A is formed over the first region 100A and the second region 100B. Any suitable methods of forming the first spacer layer 80A may be used. In some embodiments, a deposition (such as CVD, ALD, or the like) may be used form the first spacer layer 80A. In some embodiments, the first spacer layer 80A may include one or more layers of, for example, an oxide material, silicon nitride (SiN), silicon oxynitride (SiON), silicon carbonitride (SiCN), silicon oxycarbonitride (SiOCN), a combination thereof, or the like.

Referring further to FIGS. 8A-C, lightly doped source/drain (LDD) regions 75 may be formed in the substrate 50 in the first region 100A and the second region 100B. In some embodiments, a mask (not shown), such as a photoresist, may be formed over the first region 100A, e.g., the NMOS region, while exposing the second region 100B, e.g., the PMOS region, and P-type impurities may be implanted into the exposed fins 56 to create LDD regions 75 in the second region 100B. The mask may then be removed. Subsequently, a second mask (not shown), such as a photoresist, may be formed over the second region 100B, while exposing the first region 100A, and N-type impurities may be implanted into the exposed fins 56 to create LDD regions 75 in the first region 100A. The second mask may then be removed. During the implantation of the LDD regions 75, the dummy gate stack 70 may act as a mask to prevent (or at least reduce) dopants from implanting into a channel region of the exposed fins 56. Thus, the LDD regions 75 may be formed substantially in source/drain regions of the exposed fins 56. The N-type impurities may be any of the N-type impurities previously discussed, and the P-type impurities may be any of the P-type impurities previously discussed. The LDD regions 75 may each have a concentration of impurities from about $10^{15}$ cm$^{-3}$ to about $10^{16}$ cm$^{-3}$. An annealing process may be performed to activate the implanted impurities. In some embodiments, the LDD regions 75 are formed prior to formation of first spacer layer 80A.

Figure 9A:
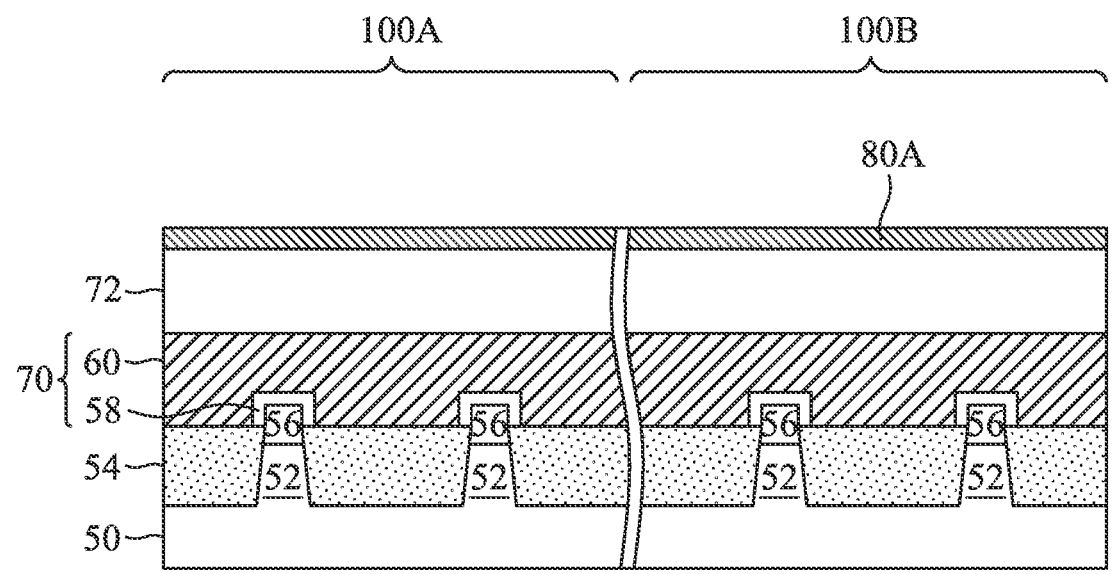
FIGS. 9A-C are cross-sectional views of intermediate stages in the manufacture of a FinFET device in accordance with some embodiments.
Figure 9B:
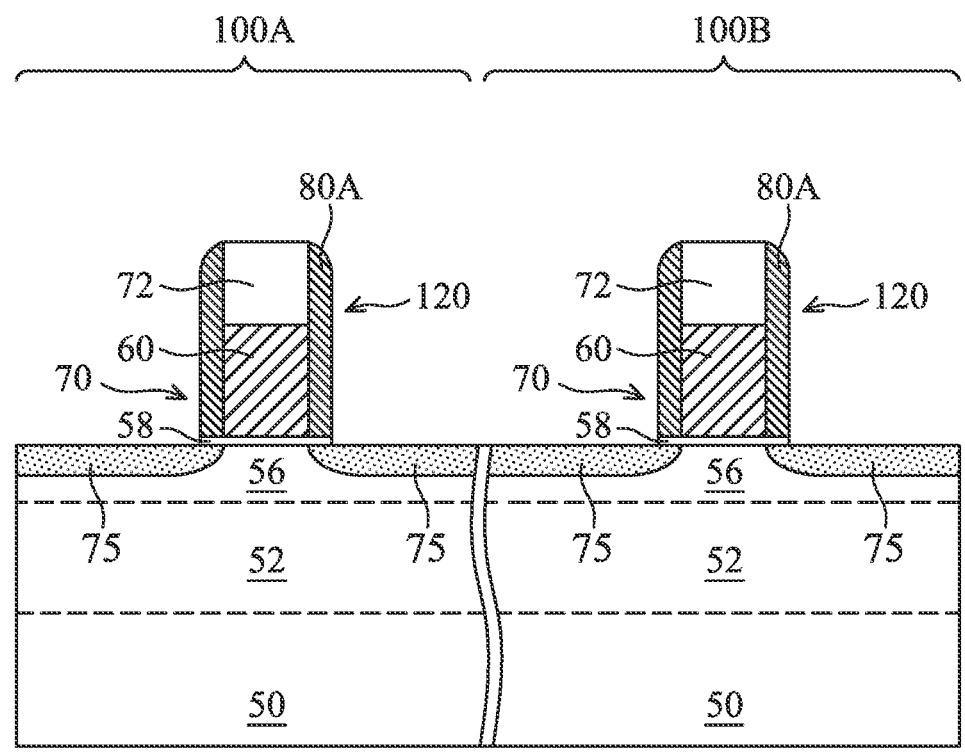
Figure 9C:
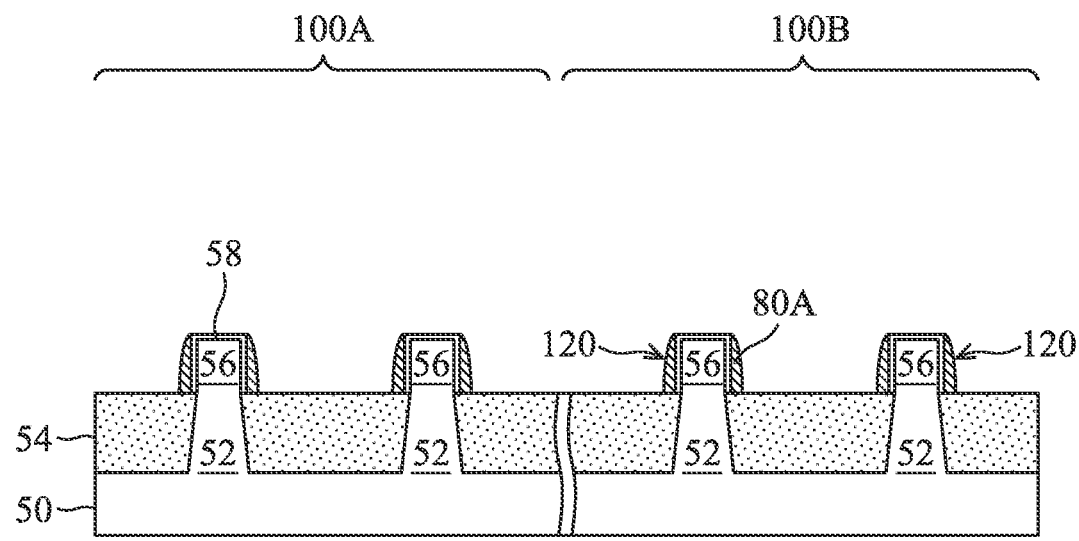

Referring to FIGS. 9A-C, an etching process is performed on portions of the first spacer layer 80A. The etching process may be a dry etch process, and may be anisotropic. After performing the etching process, lateral portions of the first spacer layer 80A over the LDD regions 75 and over the isolation regions 54 may be removed to expose top surfaces of the fins 56 and the masks 72 for the dummy gate stack 70. Portions of the first spacer layer 80A along sidewalls of the dummy gate stack 70 and the fins 56 may remain and form offset spacers 120. In other embodiments, the first spacer layer 80A may also be removed from the sidewalls of the fins 56. In some embodiments, offset spacers 120 in the first region 100A are formed at the same time as offset spacers 120 in the second region 100B, and in other embodiments, offset spacers 120 in the first region 100A and the second regions 100B are formed in separate processes. In some embodiments, lateral portions of the dummy dielectric layer 58 over the LDD regions 75 and over the isolation regions 54 may also be removed.

Figure 10A:
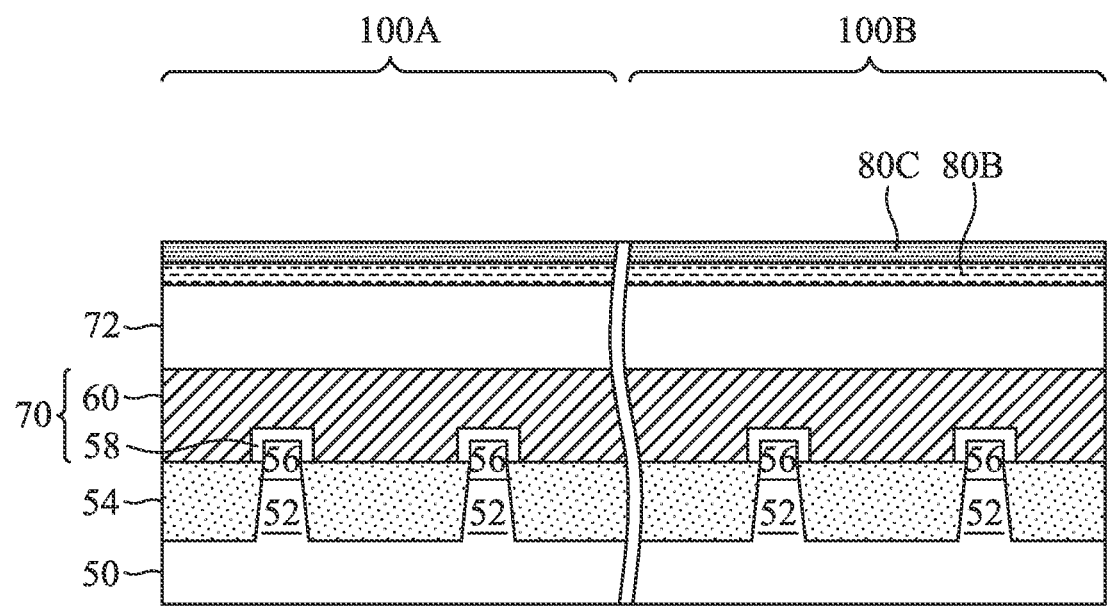
FIGS. 10A-C are cross-sectional views of intermediate stages in the manufacture of a FinFET device in accordance with some embodiments.
Figure 10B:
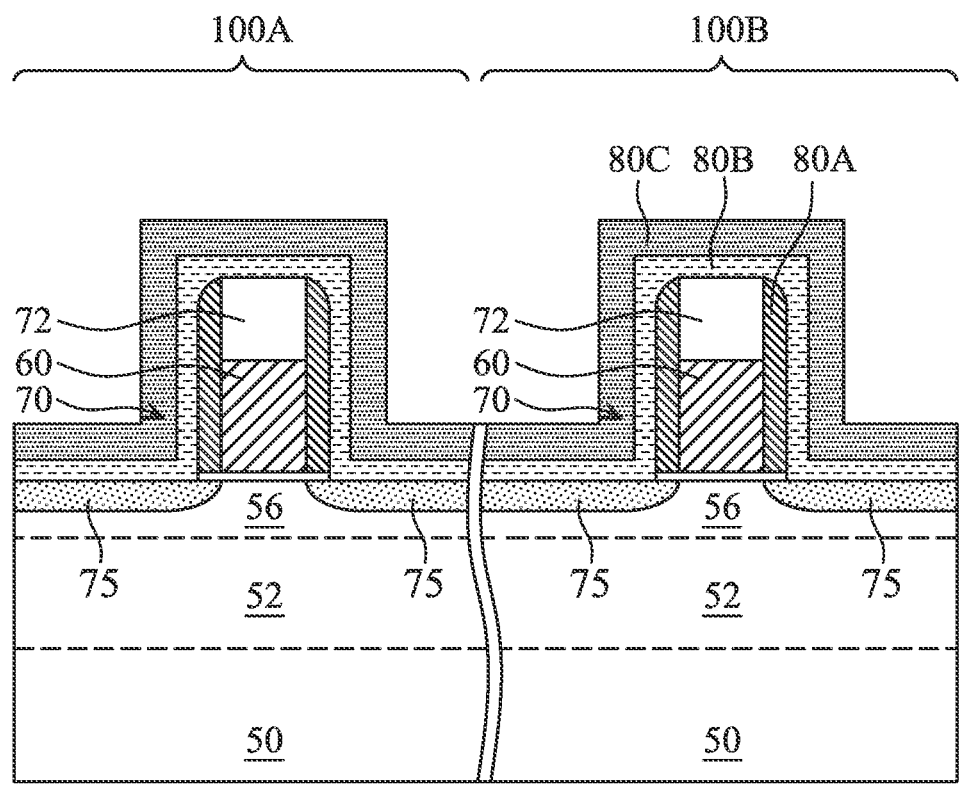
Figure 10C:
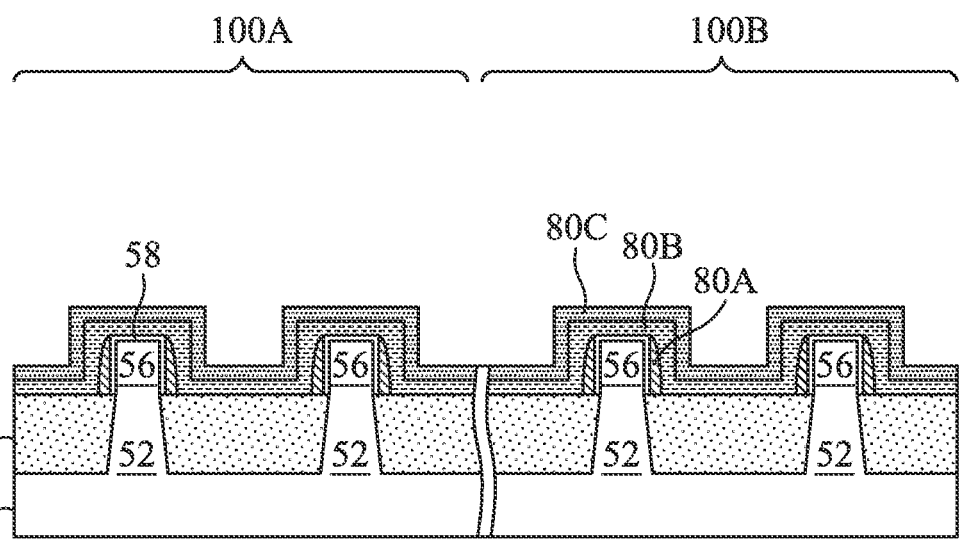

In FIGS. 10A-C, a second spacer layer 80B and a third spacer layer 80C are formed over the first region 100A and the second region 100B. Any suitable methods of forming the first spacer layer 80A may be used. In some embodiments, a deposition (such as CVD, ALD, or the like) may be used form the second spacer layer 80B or the third spacer layer 80C. In some embodiments, the second spacer layer 80B or the third spacer layer 80C may include one or more layers of, for example, an oxide material, silicon nitride (SiN), silicon oxynitride (SiON), silicon carbonitride (SiCN), silicon oxycarbonitride (SiOCN), a combination thereof, or the like. In some embodiments, one of the second spacer layer 80B or the third spacer layer 80C may be omitted.

Figure 11A:
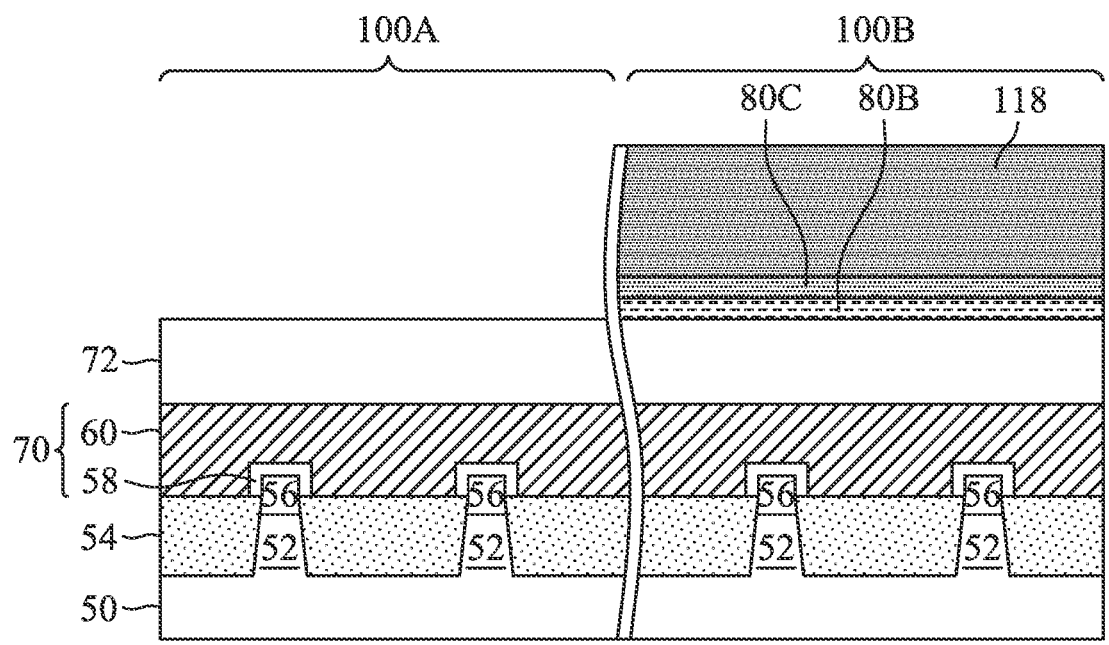
FIGS. 11A-C are cross-sectional views of intermediate stages in the manufacture of a FinFET device in accordance with some embodiments.
Figure 11B:
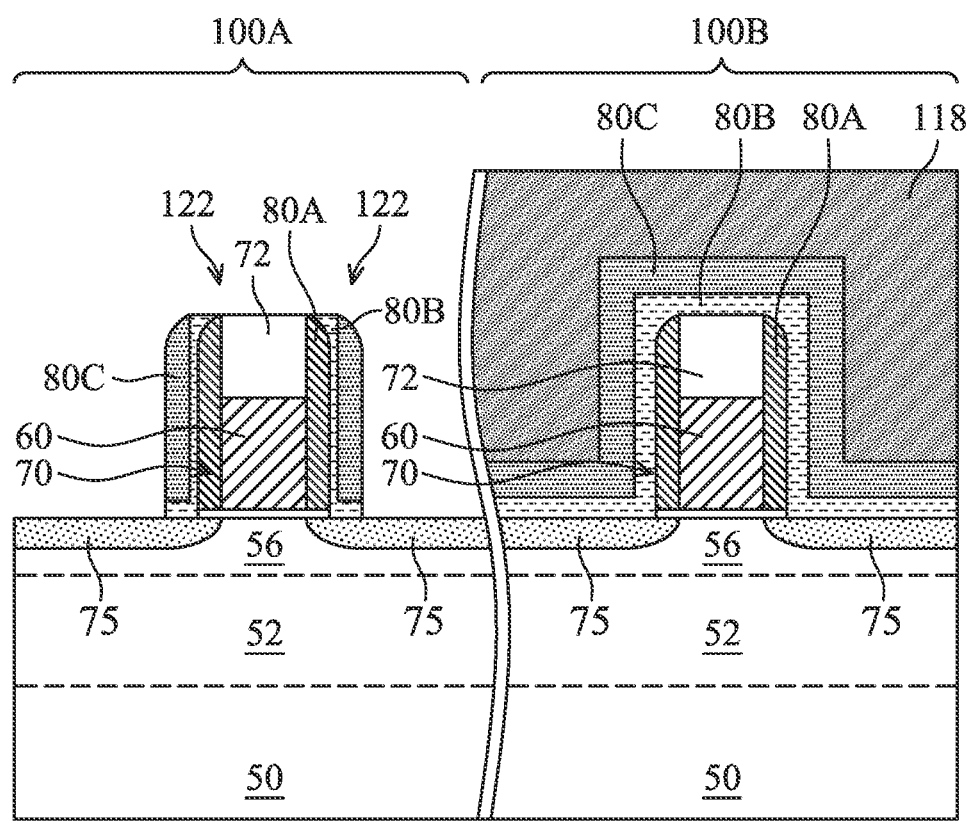
Figure 11C:
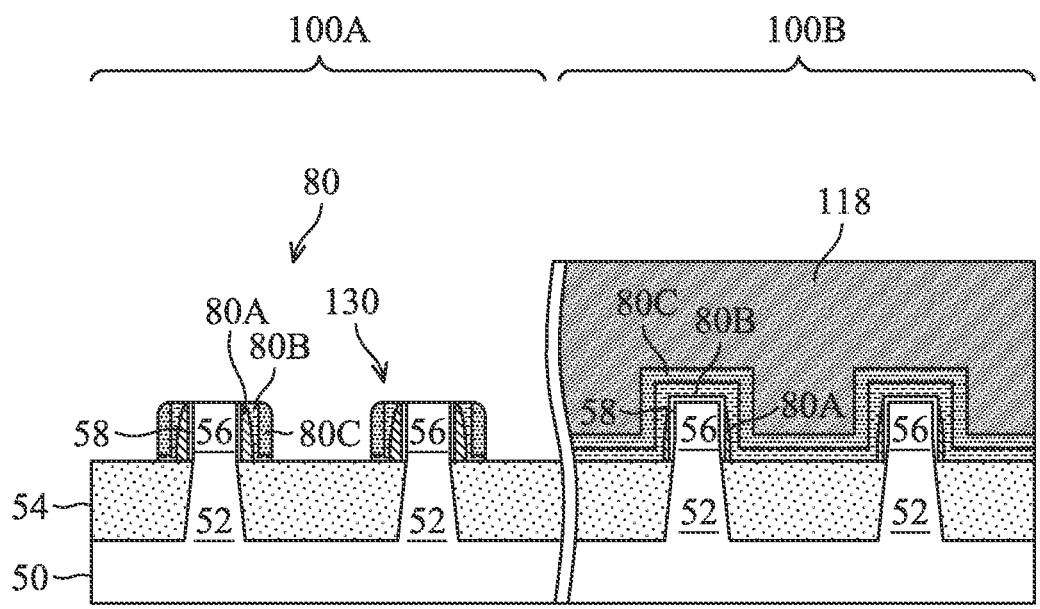

Referring to FIGS. 11A-C, a patterning process is performed to remove portions of the second spacer layer 80B and the third spacer layer 80C in the first region 100A. Any acceptable patterning process may be used. In some embodiments, mask 118 is formed over the first region 100A and the second region 100B. The mask 118 may be a single layer or may include multiple layers. In some cases, the mask 118 may include a photoresist, though the mask 118 may include other materials. The mask 118 is patterned to expose the first region 100A. The mask 118 may be patterned using suitable photolithography techniques.

Referring to FIGS. 11A-C, an etching process is performed on portions of the second spacer layer 80B and the third spacer layer 80C, using the mask 118 as a mask. The etching process may be a dry etch process, and may be anisotropic. After performing the etching process, lateral portions of the second spacer layer 80B and the third spacer layer 80C over the LDD regions 75 and over the isolation regions 54 may be removed to expose top surfaces of the fins 56 and the masks 72. Portions of the second spacer layer 80B and the third spacer layer 80C along sidewalls of the dummy gate stack 70 and the fins 56 may remain and form gate spacers 122 and fin spacers 130. In some embodiments, the gate spacers 122 and the fin spacers 130 in the first region 100A are formed at the same time as the gate spacers 122 and the fin spacers 130 in the second region 100B, and in other embodiments, the gate spacers 122 and the fin spacers 130 in the second region 100B are formed before the gate spacers 122 and the fin spacers 130 in the first region 100A are formed. In some embodiments, the second spacer layer 80B may be etched as described above before forming the third spacer layer 80C, and then the third spacer layer 80C may then be etched to form gate spacers 122 and fin spacers 130.

Figure 12A:
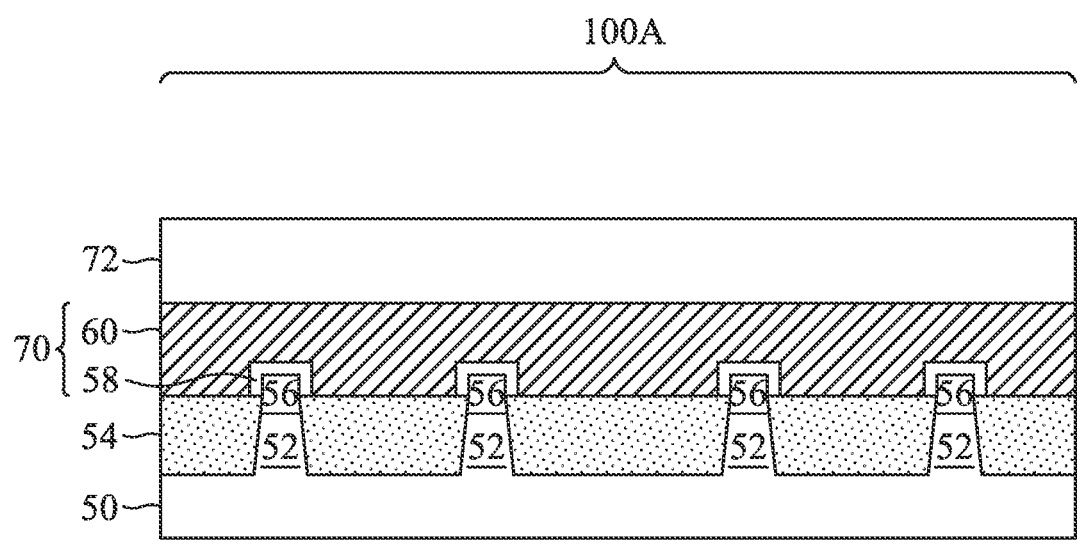
FIGS. 12A-C are cross-sectional views of intermediate stages in the manufacture of a FinFET device in accordance with some embodiments.
Figure 12B:
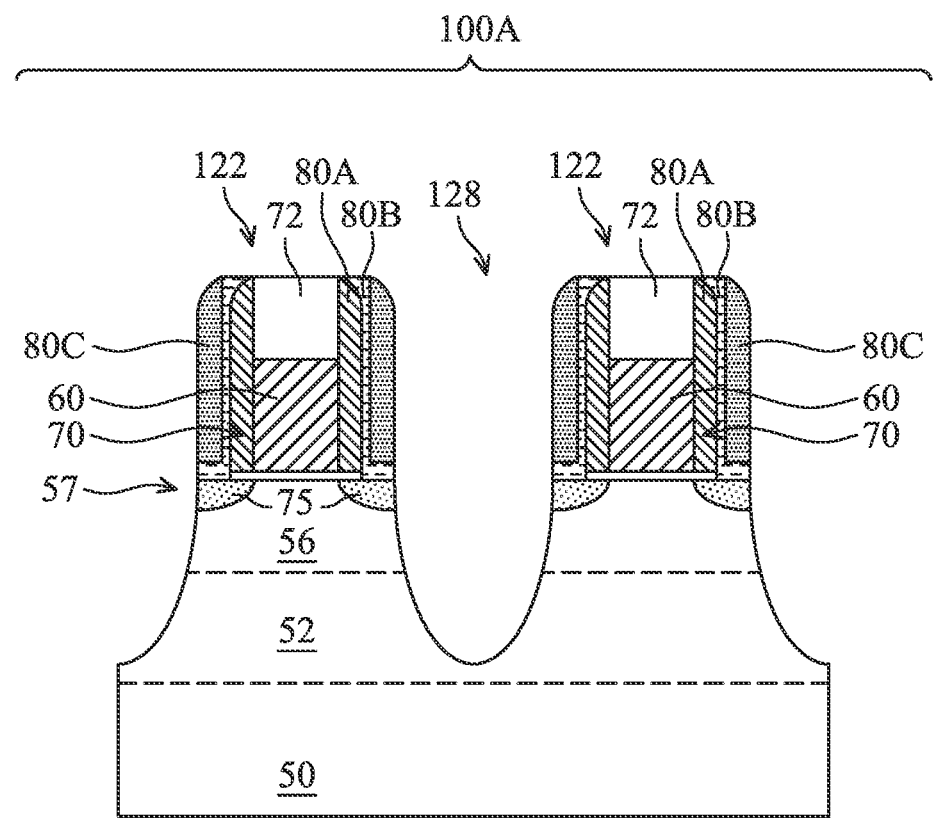
Figure 12C:
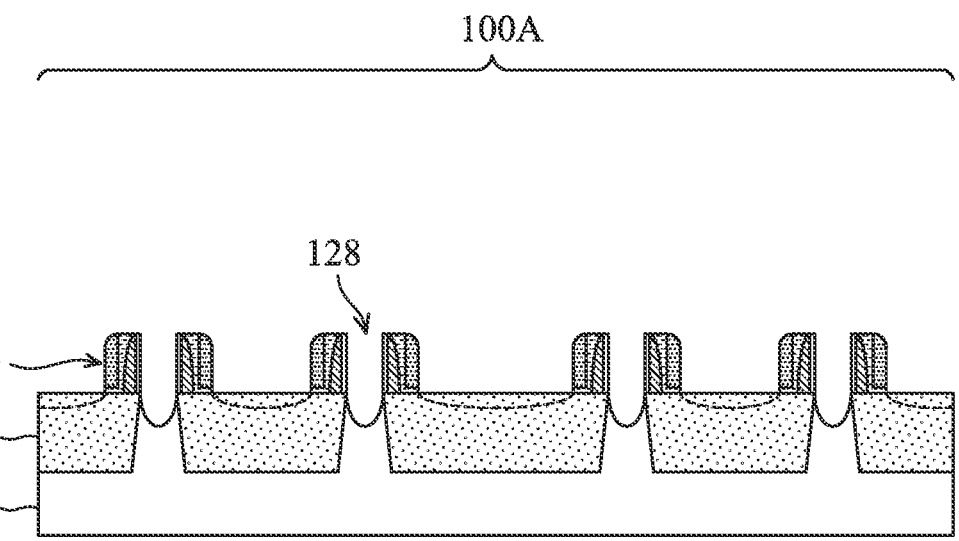

Referring to FIGS. 12A-C, a patterning process is performed on the fins 56 to form recesses 128 in source/drain regions of the fins 56. The patterning process may be performed in a manner that the recesses 128 are formed between neighboring dummy gate stacks 70 in interior regions of the fins 56 as shown in FIG. 12B, or between an isolation region 54 and adjacent dummy gate stacks 70 in end regions of the fins 56. In some cases, the recesses 128 may extend laterally under the gate spacers 122. The region of a fin 56 between recesses 128 may form a channel region 57 of the fin 56. In some embodiments, the patterning process may include a suitable anisotropic dry etching process, while using the dummy gate stacks 70, the gate spacers 122 and/or isolation regions 54 as a combined mask. The suitable anisotropic dry etching process may include a reactive ion etch (RIE), neutral beam etch (NBE), the like, or a combination thereof. In some embodiments where the RIE is used in the patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching is anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, $Cl_2$, a combination thereof, or the like. In some embodiments, the etching process is performed using a gas source having between about 5% by volume and about 30% by volume of HBr and between about 10% by volume and about 30% by volume of $Cl_2$. In some embodiments, the applied voltage bias is between about 0 kV and about 0.5 kV. In some embodiments, the etching process is performed at a temperature between about 20° C. and about 50° C. In some embodiments, the etching process is performed at a pressure between about 6 mTorr and about 20 mTorr. In some embodiments, the patterning process for forming the recesses 128 may also etch isolation regions (illustrated in FIGS. 12C-26C by dashed lines) or may also etch portions of the masks 72, gate spacers 122, or fin spacers 130.

Figure 13A:
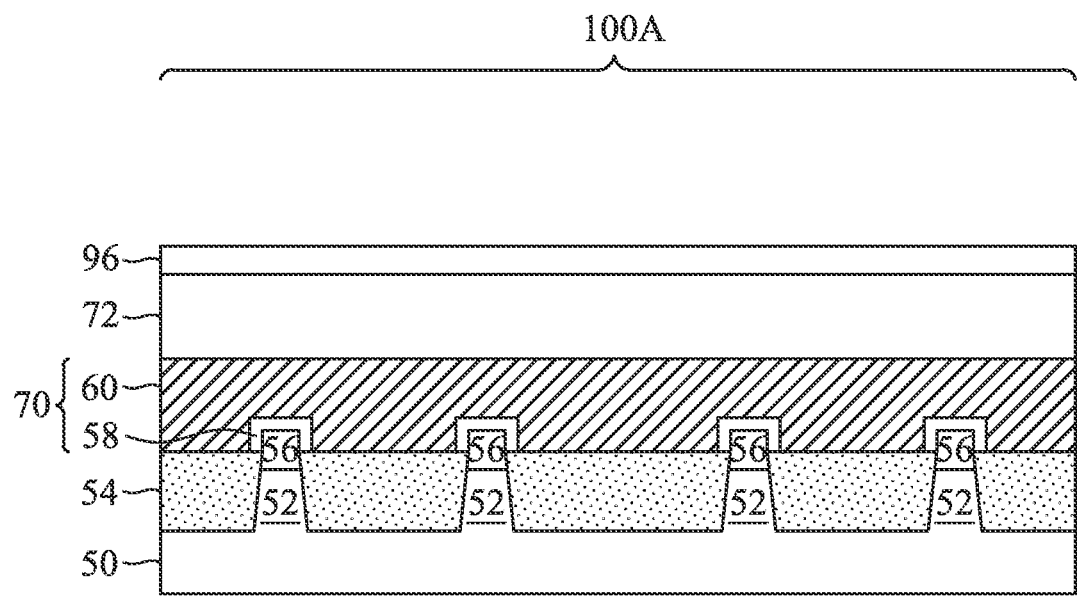
FIGS. 13A-C are cross-sectional views of intermediate stages in the manufacture of a FinFET device in accordance with some embodiments.
Figure 13B:
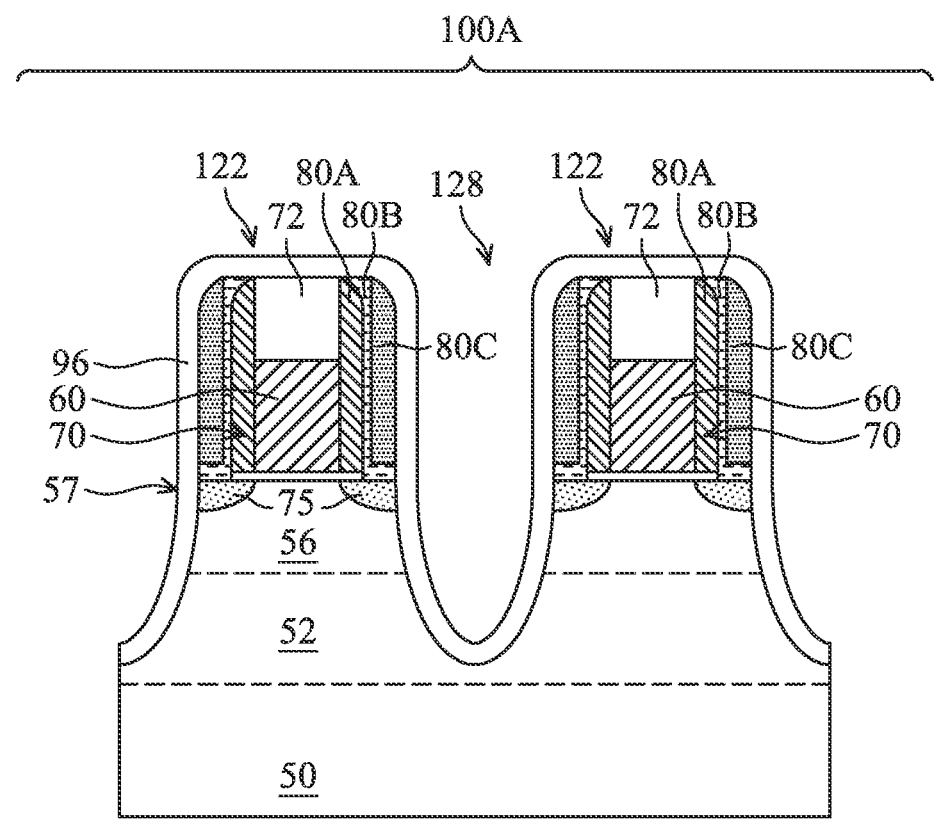
Figure 13C:
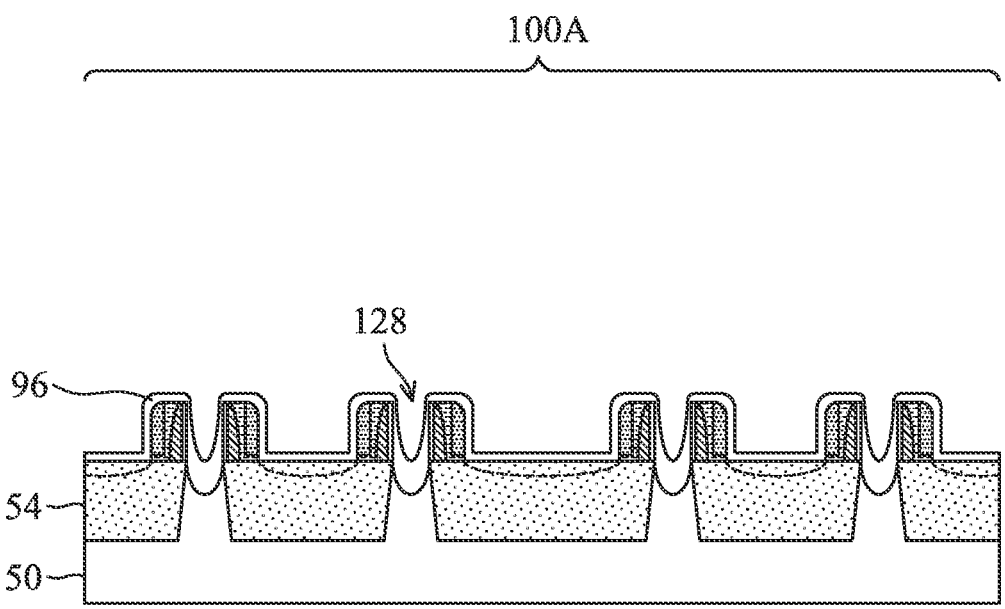

Referring to FIGS. 13A-C, a buffer layer 96 is formed over the gate spacers 122, dummy gate stacks 70, and within the recesses 128. The buffer layer 96 may also be formed over other surfaces, for example, as a blanket deposition. For clarity, FIGS. 13A-C and subsequent figures show only region 100A, though similar processes may be performed with regard to region 100B. The buffer layer 96 may be a dielectric layer, and may include a material such as silicon oxide ($SiO_2$), another type of oxide, silicon nitride (SiN), another type of nitride, the like, or combinations thereof. In some cases, the buffer layer 96 may be an adhesion layer or a barrier layer, and may include multiple layers or multiple materials. In some embodiments, the buffer layer 96 may be deposited conformally and may have a thickness between about 0.5 nm and about 5 nm. The buffer layer 96 may be formed by any suitable method, such as ALD, CVD, HDP-CVD, PVD, a combination thereof, or the like. In some cases, the presence of the buffer layer 96 improves adhesion of the stressor material 98 on the channel regions 57 of the fins 56 or on other regions of the fins 56, described in greater detail below. In some embodiments, the buffer layer 96 is omitted.

Figure 14A:
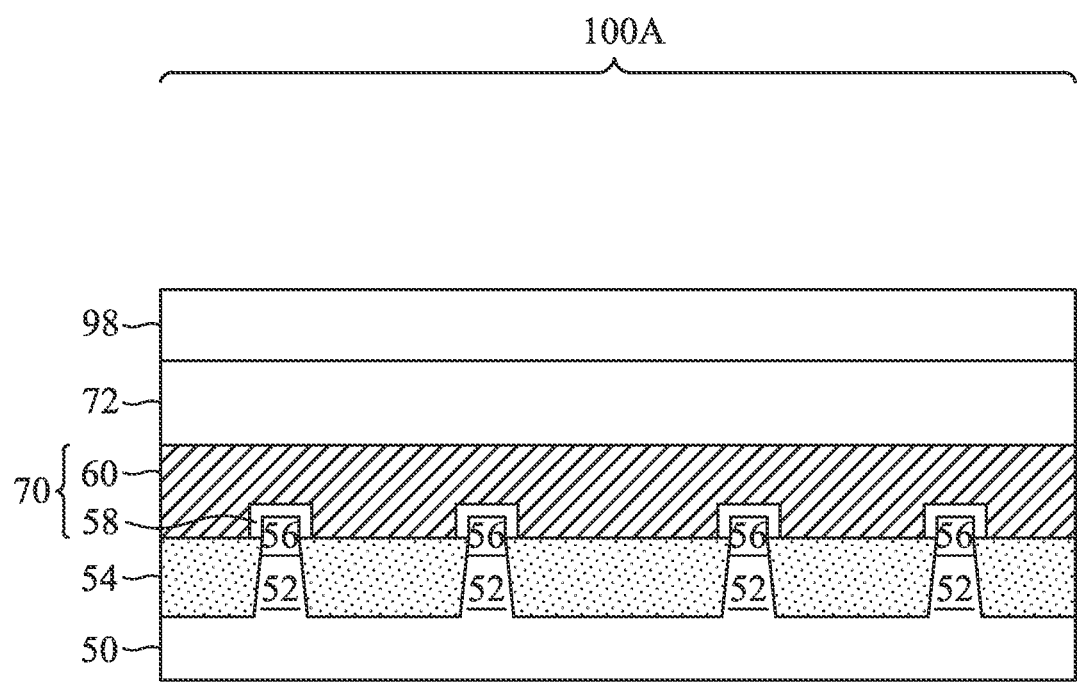
FIGS. 14A-C are cross-sectional views of the formation of a stressor material in the manufacture of a FinFET device in accordance with some embodiments.
Figure 14B:
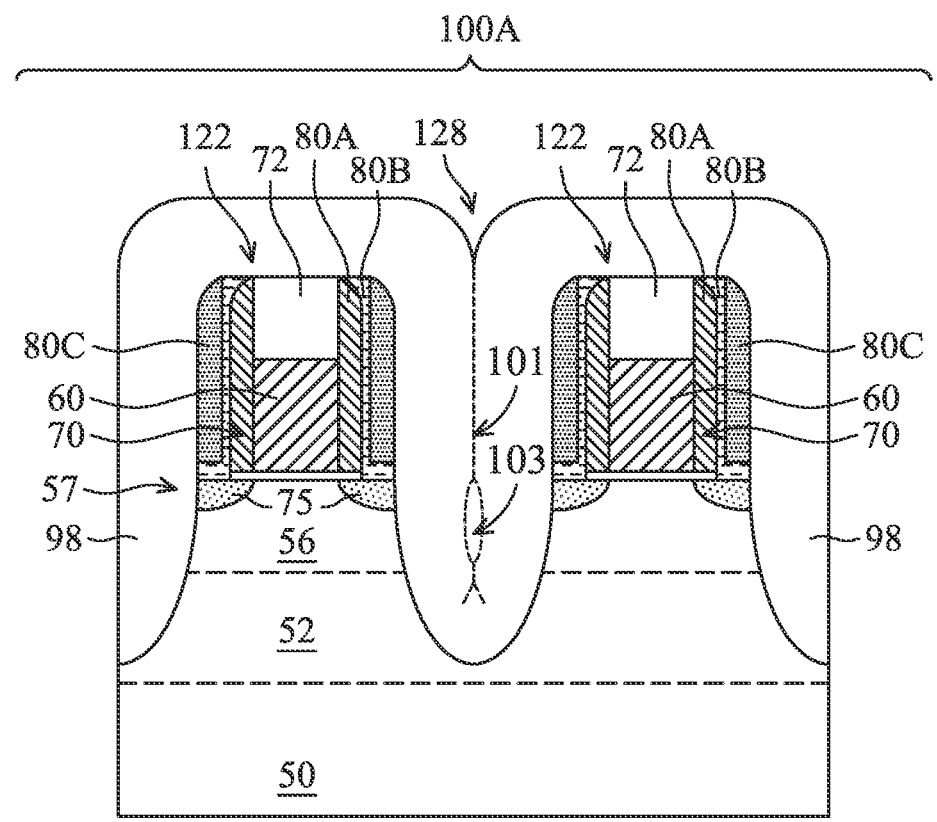
Figure 14C:
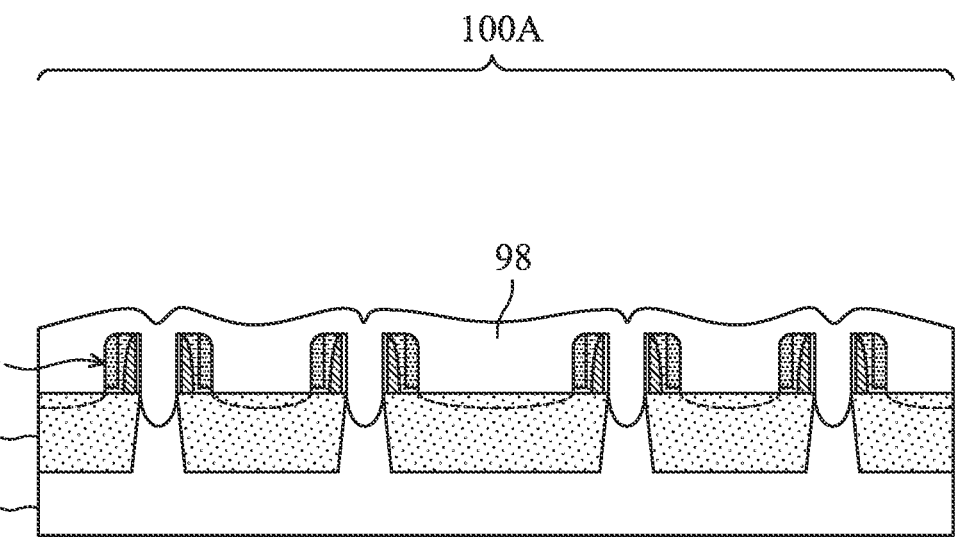

Referring to FIGS. 14A-C, a stressor material 98 is formed over the buffer layer 96. For clarity, the buffer layer 96 is not shown in FIGS. 14A-C or subsequent figures. The stressor material 98 may be formed within the recesses 128, over surfaces of the fins 56, or over surfaces of the semiconductor strips 52. In this manner, the stressor material 98 may be formed over surfaces (e.g., sidewalls) of channel regions 57 of the fins 56. The stressor material 98 may also be formed over the gate spacers 122, over the dummy gate stacks 70, or over other surfaces. The stressor material 98 may be deposited to fill all of the recesses 128, as shown in FIG. 14B, or may be deposited to fill some portion of the recesses 128. The stressor material 98 on adjacent dummy gate stacks 70 may merge, as shown in FIG. 14B, or there may be gaps between the stressor material on adjacent dummy gate stacks 70. In some cases, merging stressor material 98 may form a seam 101 along portions of the merging boundary, an example of which is shown in FIG. 14B. In some cases, the merging stressor material 98 may form one or more air gaps or voids 103 at the merging boundary, an example of which is shown in FIG. 14B. In some embodiments, the stressor material 98 may be formed having a thickness between about 15 nm and about 30 nm.

The stressor material 98 may include one or more materials that can be used to provide a stress on the fins 56, described in greater detail below. In some embodiments, the stressor material 98 may include a material that provides tensile stress on the fins 56, such as silicon nitride (SiN), silicon carbonitride (SiCN), the like, or a combination. In some embodiments, the stressor material 98 may include a material that provides compressive stress on the fins 56. In some cases, SiN may be formed in a manner such that it provides compressive stress on the fins 56. In some embodiments, the stressor material 98 may be deposited as a porous material, such as a porous SiN material. The stressor material 98 may be formed by any suitable method, such as ALD, PE-ALD, CVD, HDP-CVD, PVD, a combination thereof, or the like.

In some embodiments, the stressor material 98 includes SiN grown using an ALD process to provide a tensile stress on the fins 56 as part of forming N-type FinFETs in the first region 100A. The ALD process may include process gases including, for example, dichlorosilane ($SiH_2Cl_2$), ammonia ($NH_3$), other precursor gases, or other gases. Other gases may also be used as purge gases, including $N_2$, Ar, Xe, or other gases. In some embodiments, an ALD process may have a process temperature between about 300° C. and about 350° C. In some embodiments, a step of an ALD cycle using dichlorosilane as a process gas may have a process pressure between about 1 and about 4 torr and a flow rate between about 500 sccm and about 5000 sccm. In some embodiments, a step of an ALD cycle using $NH_3$ as a process gas may have a process pressure between about 0.1 and about 0.5 torr and a flow rate between about 500 sccm and about 10000 sccm. In some embodiments, the total flow of NH$_3$ during an ALD process is less than 10 times the total flow of other precursor gases (e.g., dichlorosilane) used during the ALD process. In some embodiments, a purge step between a dichlorosilane step and an ammonia step may include flowing a purge gas at a rate between about 500 sccm and about 20000 sccm and may include flowing the purge gas for about 6 seconds or less. These are example process conditions, and other process conditions may be used in other embodiments. In some cases, reducing process temperature, reducing the NH$_3$ flow, or reducing the duration of purge gas flow may increase the subsequent stress produced on the fins 56 by the stressor material 98, described in greater detail below.

Figure 15:
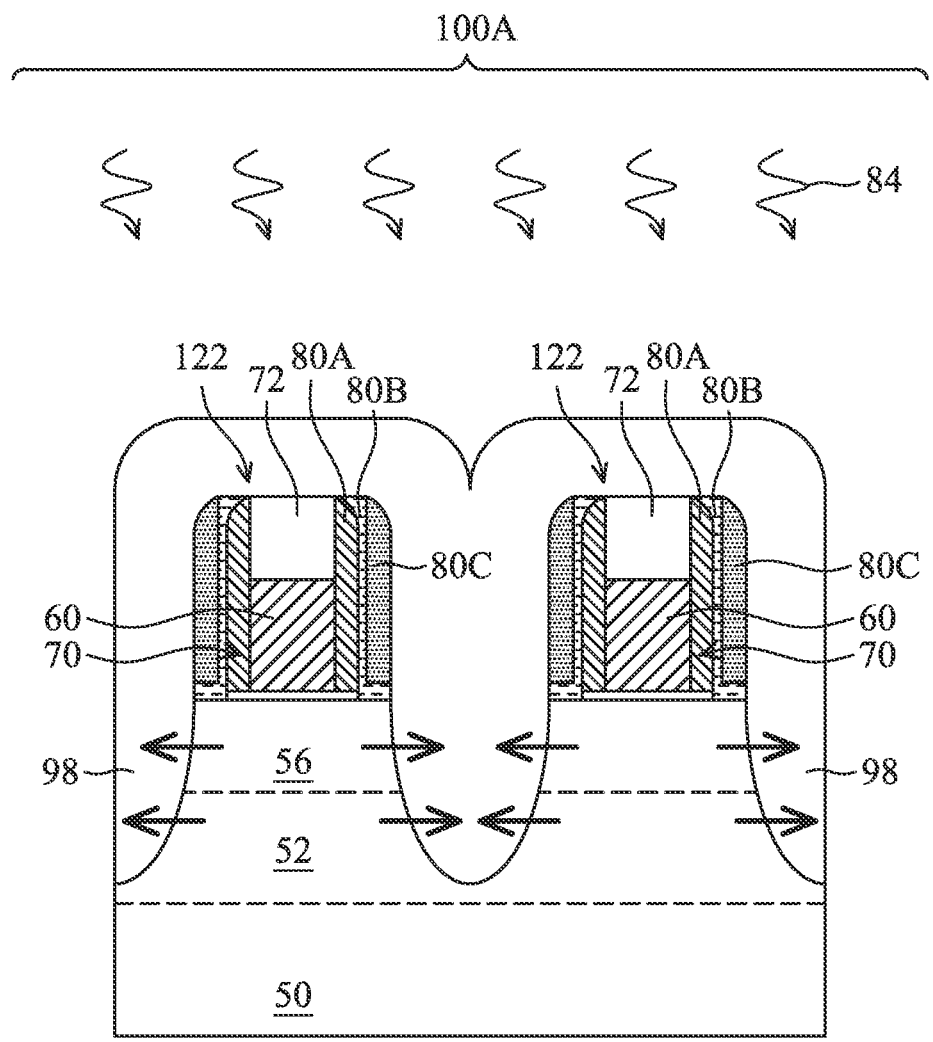
FIG. 15 is a cross-sectional view of an annealing process in the manufacture of a FinFET device in accordance with some embodiments.

Referring to FIG. 15, an anneal process 84 is performed on the stressor material 98. The anneal process 84 may include, for example, a high temperature anneal process and/or a UV curing process. The anneal process 84 causes the stressor material 98 to expand (providing compressive stress on the fins 56) or contract (providing tensile stress on the fins 56). In some cases, the expansion or contraction of the stressor material 98 is due to the anneal process 84 breaking atomic bonds in the stressor material 98. In some embodiments, the anneal process 84 includes a high temperature anneal at a temperature between about 800° C. and about 1000° C. for between about 0.5 hours and about 2 hours. A high temperature anneal may be performed using a Rapid Thermal Anneal (RTA) chamber, furnace, or other suitable system. In some embodiments, the anneal process includes a UV curing process at a temperature between about 500° C. and about 700° C. for between about 2 hours and about 5 hours. In some embodiments, the UV source has a power between about 50 Watts and about 500 Watts. In some cases, the anneal process 84 may be performed in a gaseous atmosphere, such as an atmosphere comprising nitrogen, argon, hydrogen, the like, or a combination. In some embodiments, a gas such as nitrogen (N$_2$) may be flowed into the anneal system at a flow rate between about 500 sccm and about 20000 sccm. These are example anneal processes that may be used alone or in combination for the anneal process 84, and other types of anneals or anneals having other parameters are within the scope of this disclosure.

In some embodiments, the parameters of the anneal process 84 may be controlled to control the amount of stress that the stressor material 98 provides. For example, exposing the stressor material 98 to a higher temperature can cause more expansion or contraction of the stressor material 98, and thus increase the amount of stress provided. As another example, the use of a higher temperature during the anneal process 84 can also cause greater stress provided by the stressor material 98. Thus, the stress provided by the stressor material 98 may be controlled by controlling the parameters of the deposition of the stressor material 98 (as described previously) and also by controlling the parameters of the anneal process 84. For some exemplary embodiments in which the stressor material 98 is SiN, the anneal process 84 may result in a volume contraction of the stressor material 98 between 0% and about 10%, such as about 3%. In some cases, increasing the temperature or duration of the anneal process 84 as described may cause increased contraction of a SiN stressor material 98. In this manner, a stress between 0 GPa and about 4.0 GPa may be imparted on a semiconductor fin 56 by the stressor material 98. For example a SiN stressor material 98 may provide as much as about 4.0 GPa of tensile stress on a channel region 57 of a semiconductor fin 56. Moreover, controlling the formation and/or anneal process 84 of the stressor material 98 as described allows for control of the amount of stress provided to the channel region 57 of a fin 56, and thus allows for control of the mobility of carriers in the channel region 57 of the fin 56. By depositing the stressor material 98 within the recesses 128, the stressor material 98 is formed on the sidewalls of the fins 56, and thus may provide more direct stress to the channel region 57 and provide stress over a greater region of the channel region 57. In some embodiments, the stressor material 98 may also provide stress to the fins 56 below the channel region 57. Through the use of a stressor material 98 formed adjacent a channel region 57 as described herein, the channel region 57 may be more stressed. For example, through the use of a stressor material 98 as described herein, a stress greater than 2.5 GPa may be provided to the channel region 57. In this manner, the mobility of carriers within the channel region 57 may be additionally improved due to the greater stress. In some cases, a relatively high stress (e.g., greater than about 2.5 GPa) may distort the crystalline lattice of a fin 56 in a portion of the fin 56. In some cases, a lattice distortion may be extended vertically within the fin 56. In some embodiments, the length of the lattice distortion of a fin 56 due to the stress is between about 50% and about 90% the depth of the recess.

In some embodiments, the stressor material 98 may be formed having multiple layers. The multiple layers may be different materials, or the same material formed using different process conditions. The different layers of the stressor material 98 may provide different stresses to the fins 56, and the stress on the fins 56 may be controlled by controlling the properties of different layers of the stressor material 98. In some embodiments, the stress at different locations on the fins 56 may be controlled in this manner. As an example, for a SiN stressor material 98, multiple layers of SiN may be formed at different temperatures, and thus each layer of SiN may provide different amounts of stress to the fins 56. In some cases, the stressor material 98 may include one or more layers providing tensile stress and/or one or more layers providing compressive stress. In some cases, a layer of SiN may provide either tensile stress or compressive stress, depending on the process used to form the SiN in that layer. An anneal process 84 may be performed after forming a single layer of the stressor material 98 or after forming multiple layers of the stressor material 98. In some embodiments, different layers of the stressor material 98 may be formed over different regions of a wafer or device. For example, a first layer of the stressor material 98 may be formed in recesses 128, but a second layer of the stressor material may be formed over the first layer in only some of the recesses 128. In some embodiments, similar processes may be used to form N-type FinFETs in region 100A and P-type FinFETs in region 100B. For example, in region 100A, the stressor material 98, the parameters of the formation of the stressor material 98, and the parameters of the anneal process 84 may be selected to provide a tensile stress onto the fins 56 of N-type FinFETs. in region 100A. In region 100B, the stressor material 98, the parameters of the formation of the stressor material 98, and the parameters of the anneal process 84 may be selected to provide a compressive stress onto the fins 56 of the P-type FinFETs, and thus may be different from those used in region 100A. These are illustrative examples, and other a materials, processes, or configurations are within the scope of this disclosure.

Turning to FIGS. 16A-D, an exemplary embodiment of forming multiple layers of stressor material 98 is shown.

Figure 16A:
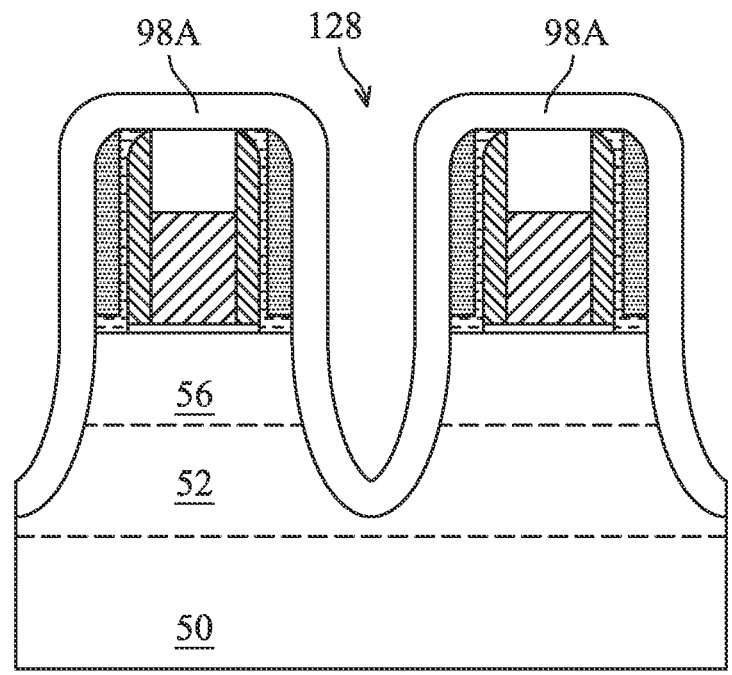
FIGS. 16A-D are cross-sectional views of the formation of multiple layers of stressor materials in the manufacture of a FinFET device in accordance with some embodiments.
Figure 16B:
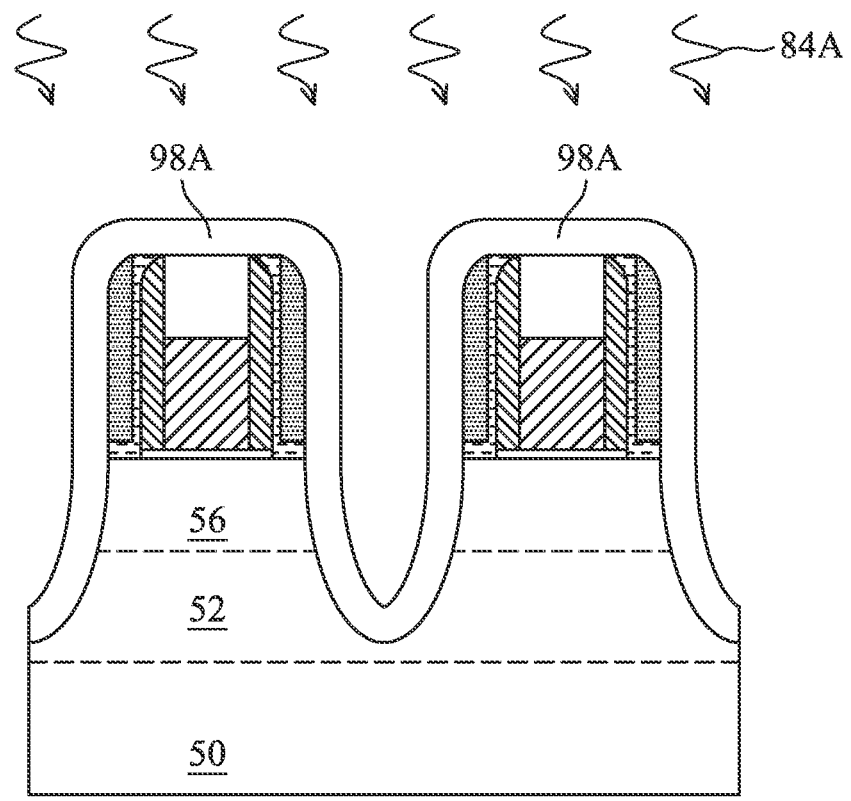
Figure 16C:
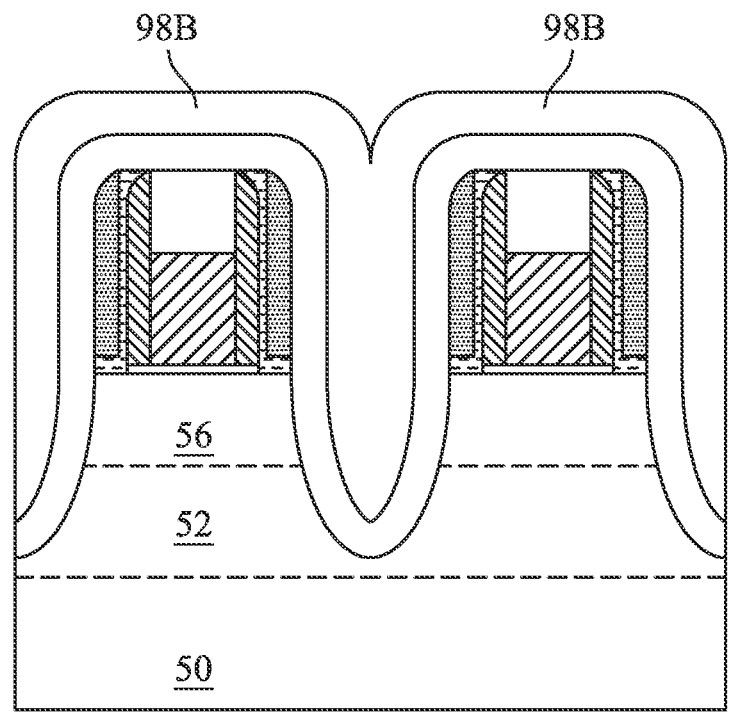
Figure 16D:
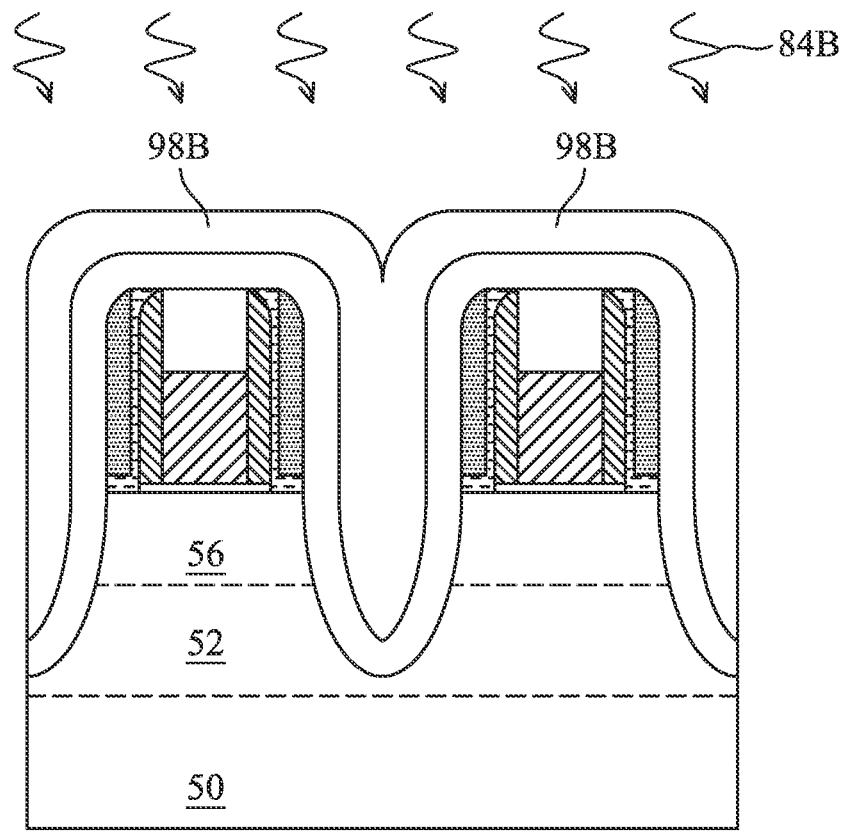

FIGS. 16A-D show a cross-sectional view of a FinFET device, similar to that shown in FIG. 15 and elsewhere herein. In FIG. 16A, a first layer 98A of stressor material is formed. The first layer 98A is formed using a first set of processing conditions (e.g., temperature, material, thickness, crystalline orientation, etc.). In FIG. 16B, a first anneal process 84A is performed. The first anneal process 84A may have a first set of anneal conditions (e.g., temperature, duration, technique, etc.). After the first anneal process 84A, the first layer 98A may provide a stress to the fins 56. In some embodiments, after formation, some or all of the first layer 98A may be removed from some regions prior to or after the first anneal process 84A. In FIG. 16C, a second layer 98B of stressor material is formed over the first layer 98A. The second layer may be formed using a second set of deposition process conditions (e.g., temperature, material, thickness, crystalline orientation etc.) that may be different from the first set of deposition process conditions or the same as the first set of deposition process conditions. For example, the second layer may be the same material as the first layer or may be a different material as the first layer. As an example, both the first layer and the second layer may be SiN, and the SiN of the first layer may be formed using different deposition process conditions than the SiN of the second layer. In FIG. 16D, a second anneal process 84B is performed. The second anneal process 84B may have a second set of anneal conditions (e.g., temperature, duration, technique, etc.) the same as the first set of anneal conditions or different from the first set of anneal conditions. After the second anneal process 84B, the second layer 98B may provide a stress to the fins 56 in addition to the first layer 98A. In some embodiments, the second layer 98B may provide a similar stress as the first layer 98A or may provide a stress that counteracts or lessens the stress from the first layer 98A. In some embodiments, the second layer 98B may be formed only over certain regions of the first layer 98A. For example, the second layer 98B may be formed over some devices and not formed over other devices. In some embodiments, after formation, some of or all of the second layer 98B may be removed from some regions prior to or after the second anneal process 84B. In other embodiments, more than two layers of stressor material may be used. These are examples, and other embodiments are within the scope of this disclosure.

Figure 17A:
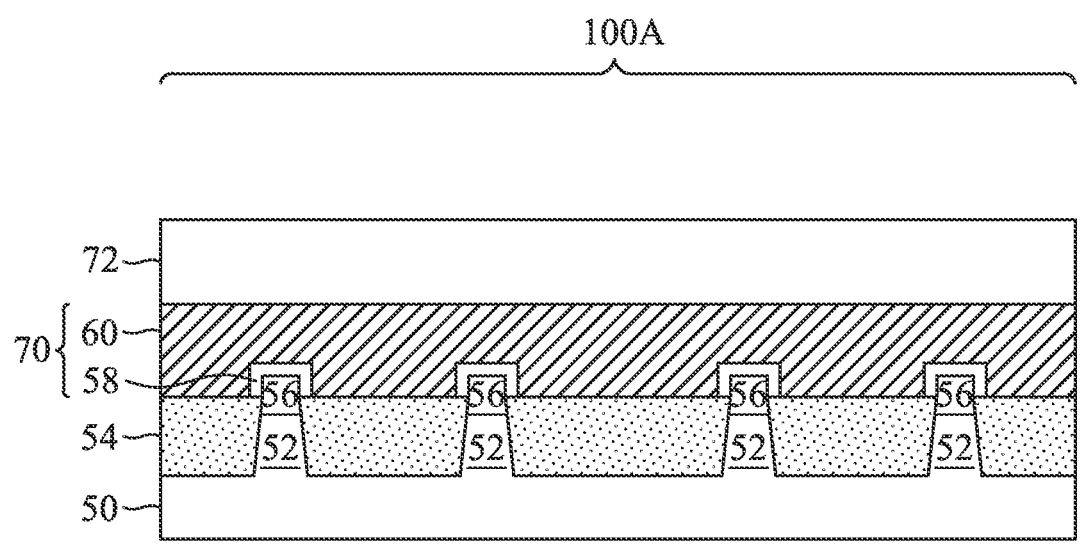
FIGS. 17A-C are cross-sectional views of the formation of a stressor material in the manufacture of a FinFET device in accordance with some embodiments.
Figure 17B:
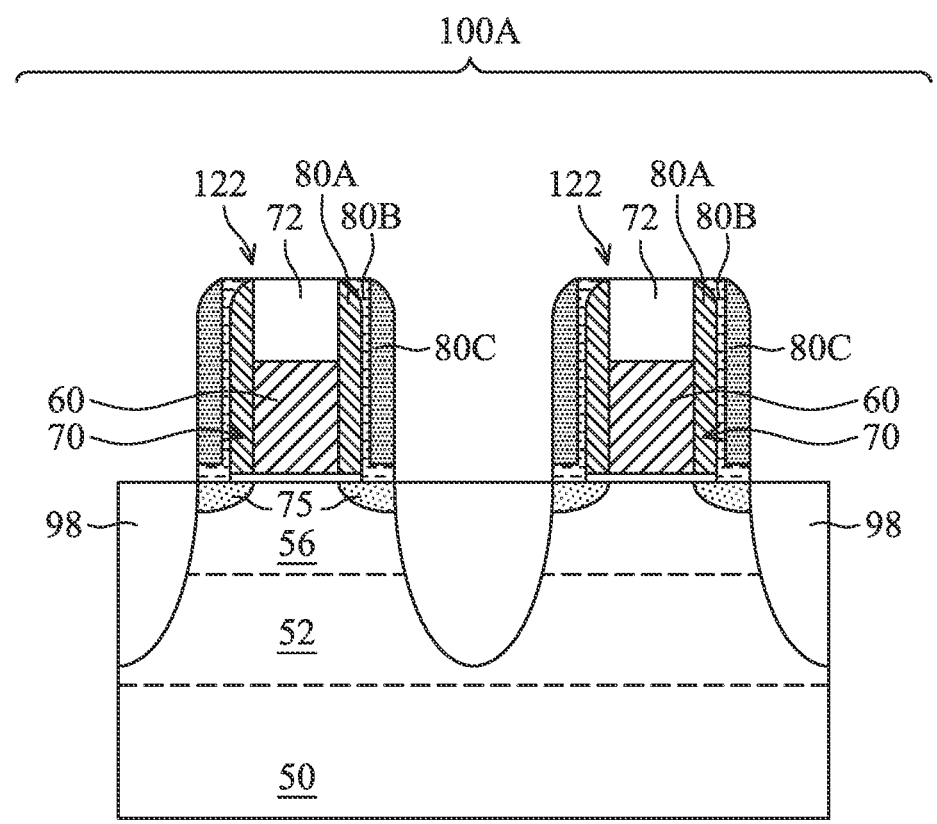
Figure 17C:
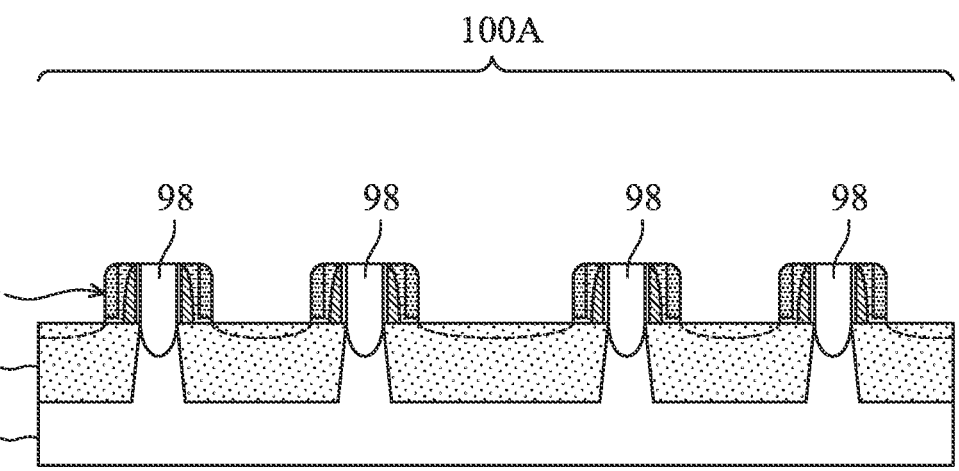

Turning to FIGS. 17A-C, after the anneal process 84 shown in FIG. 15, portions of the stressor material 98 are removed. Some of the stressor material 98 may remain in the recesses 128 such that stress is provided to the fins 56 during subsequent processing. In this manner, less of the stress of the fins 56 may decay during subsequent processing, and the "stress memory" of the fins 56 may be improved. Portions of the stressor material 98 may be removed such that the remaining stressor material 98 is approximately level with the top of the fins 56, as shown in 17B. In some embodiments, the remaining stressor material 98 may extend above the top of the fins 56. In some embodiments, the stressor material 98 may be removed such that the remaining stressor material 98 is below the top of the fins 56. In some embodiments, a different amount of stressor material 98 may be removed from some recesses 128 than from other recesses 128. For example, more stressor material 98 may be removed from regions in which less stress is desired. In some cases, the stressor material 98 may be completely removed from some regions. The stressor material 98 may be removed using a CMP process, a dry etching process, a wet etching process, or other techniques. In some embodiments, the stressor material 98 may be removed using a combination of a CMP process and a wet etching process. In some embodiments, a CMP process may be performed first and followed by an etching process.

Figure 18A:
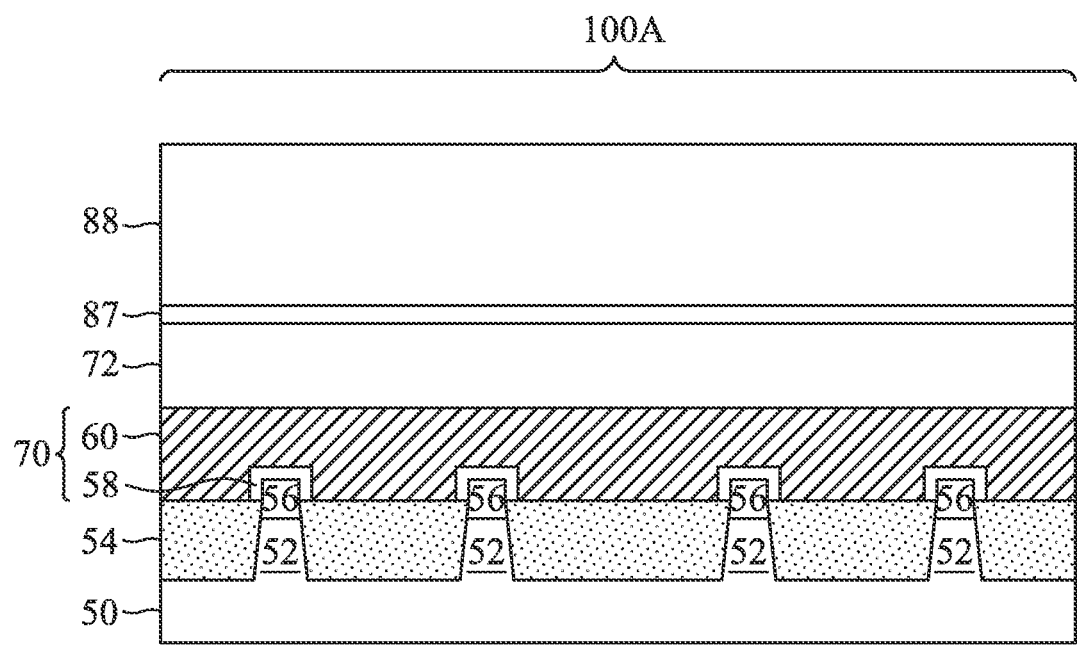
FIGS. 18A-C are cross-sectional views of the formation of a stressor material in the manufacture of a FinFET device in accordance with some embodiments.
Figure 18B:
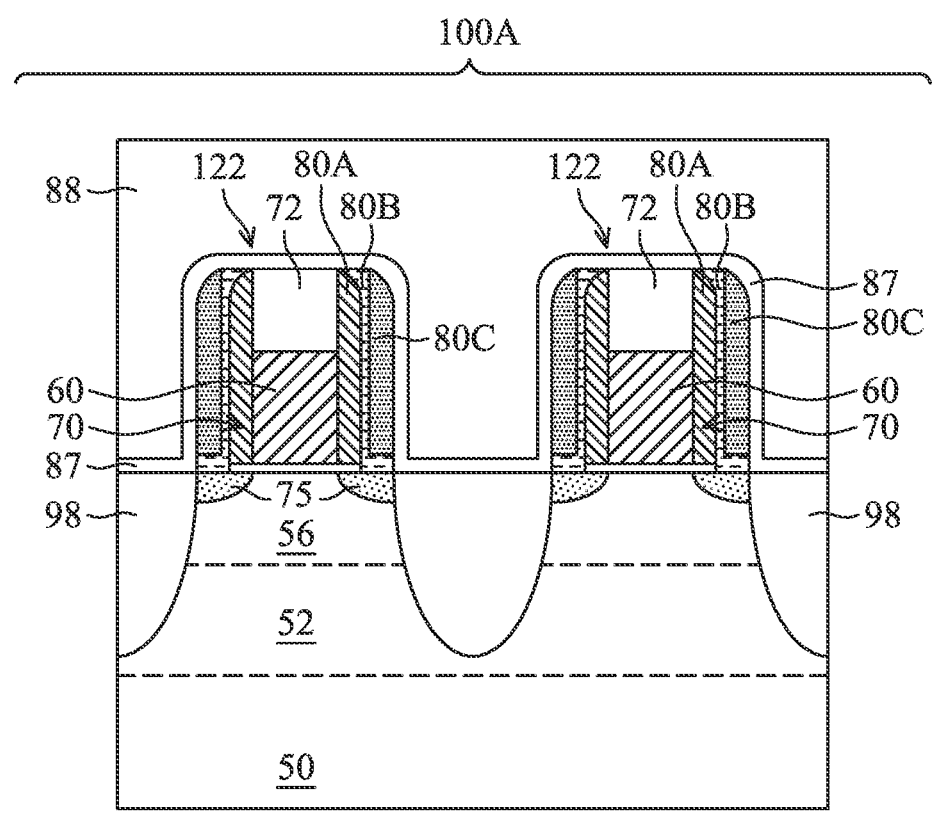
Figure 18C:
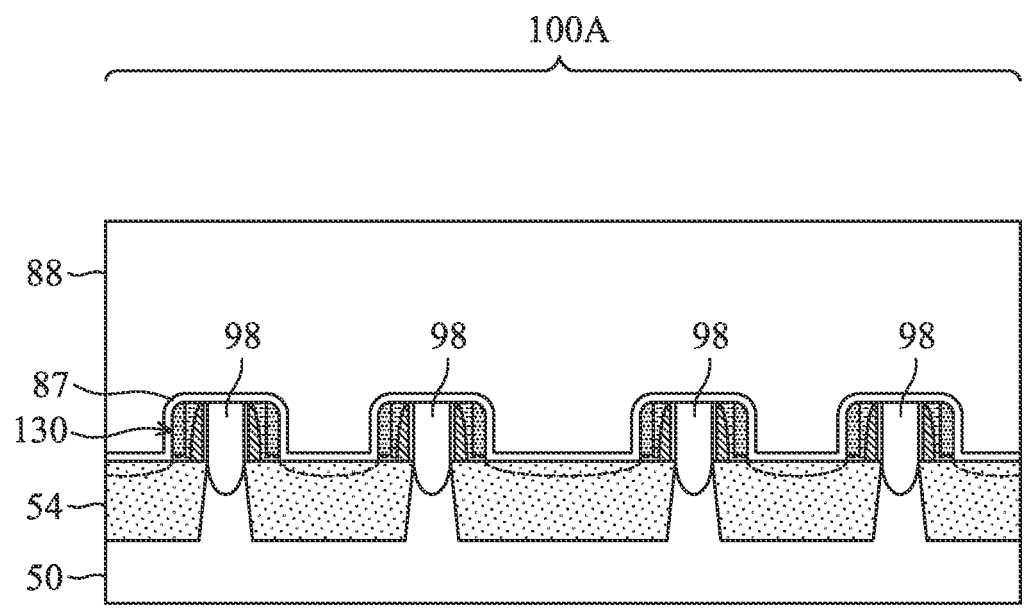

Referring further to FIGS. 18A-C, an etch stop layer 87 and an interlayer dielectric (ILD) 88 are deposited over the dummy gate stacks 70, and over the stressor material 98. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88.

Figure 19A:
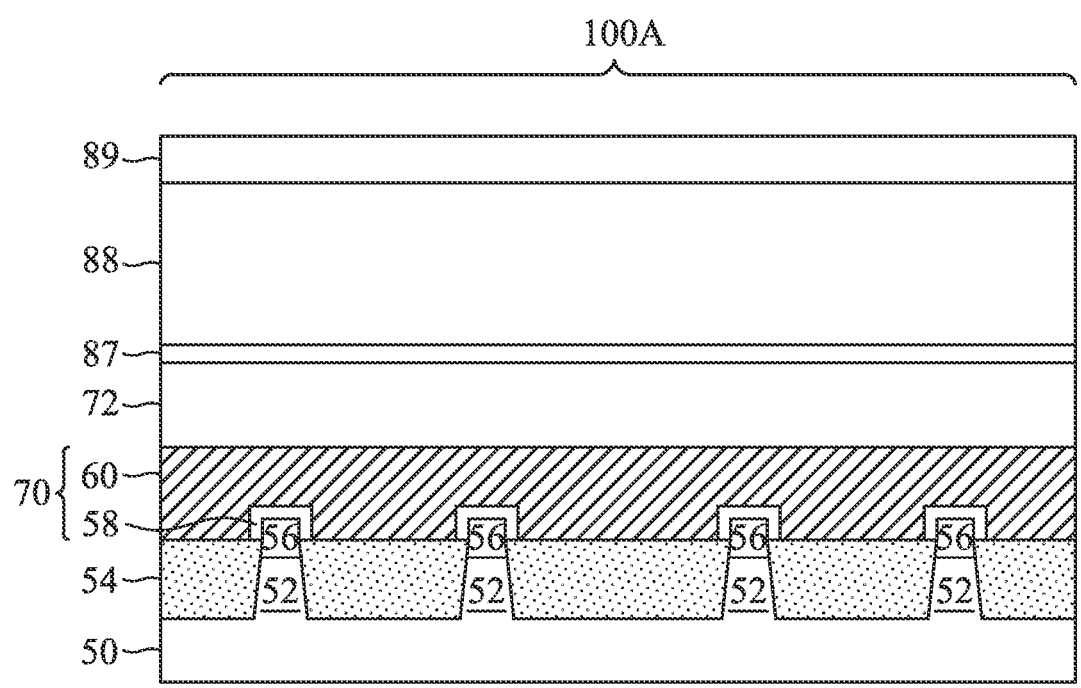
FIGS. 19A-C are cross-sectional views of the formation of a stressor material in the manufacture of a FinFET device in accordance with some embodiments.
Figure 19B:
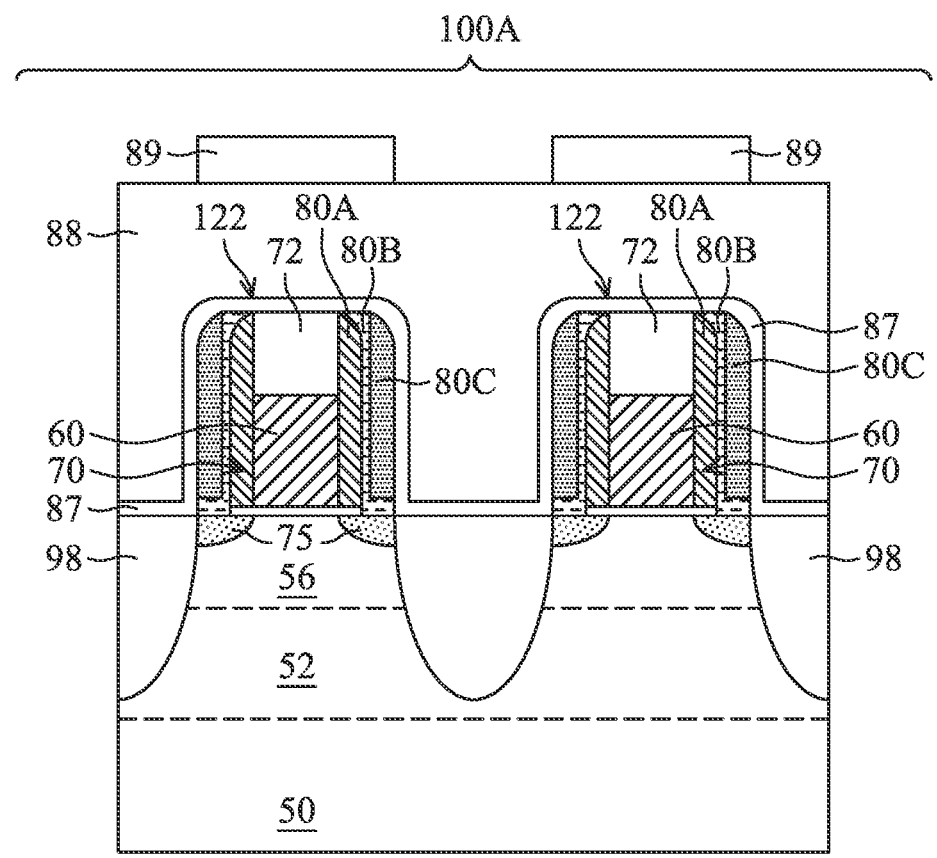
Figure 19C:
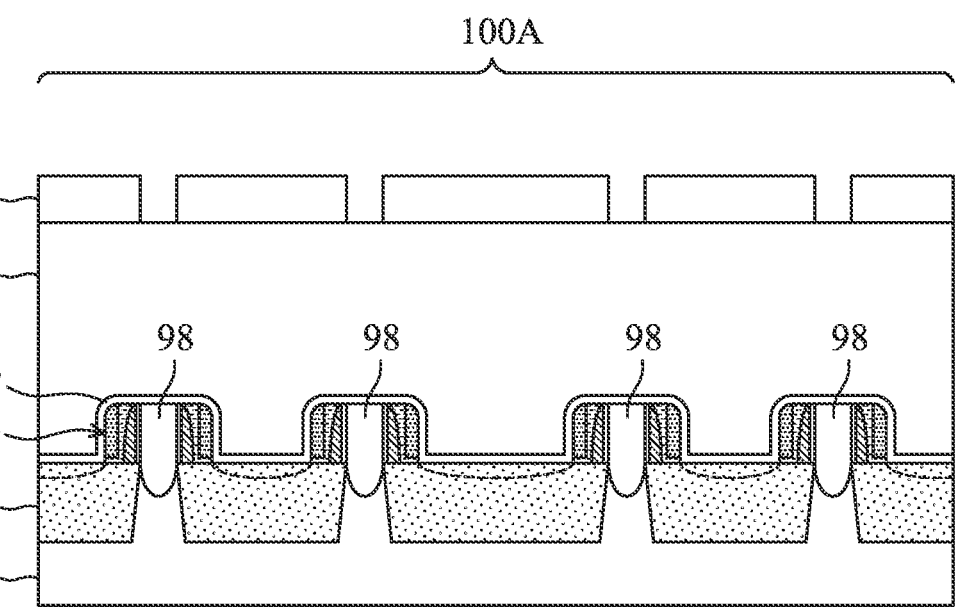

Referring to FIGS. 19A-C, a mask 89 is formed over the ILD 88 and then patterned. The mask 89 is pattered to expose areas of the ILD 88 that will be etched to expose the stressor material 98, which will then be removed. The mask 89 may be a hardmask, and may include one or more layers of, for example, silicon nitride, silicon oxynitride, silicon carbide, silicon carbonitride, the like, or a combination thereof. In some embodiments, the mask 89 is formed from a photoresist material or another material. The mask 89 may be patterned using acceptable photolithography and etching techniques. In this exemplary embodiment, the mask 89 is formed and the ILD 88 is etched immediately after the ILD 88 is formed. However, in other embodiments, other processing steps are performed after the ILD 88 is formed and before the mask 89 is formed. For example, the other processing steps may include a CMP process, dummy gate replacement, gate contact formation, etc.

Figure 20A:
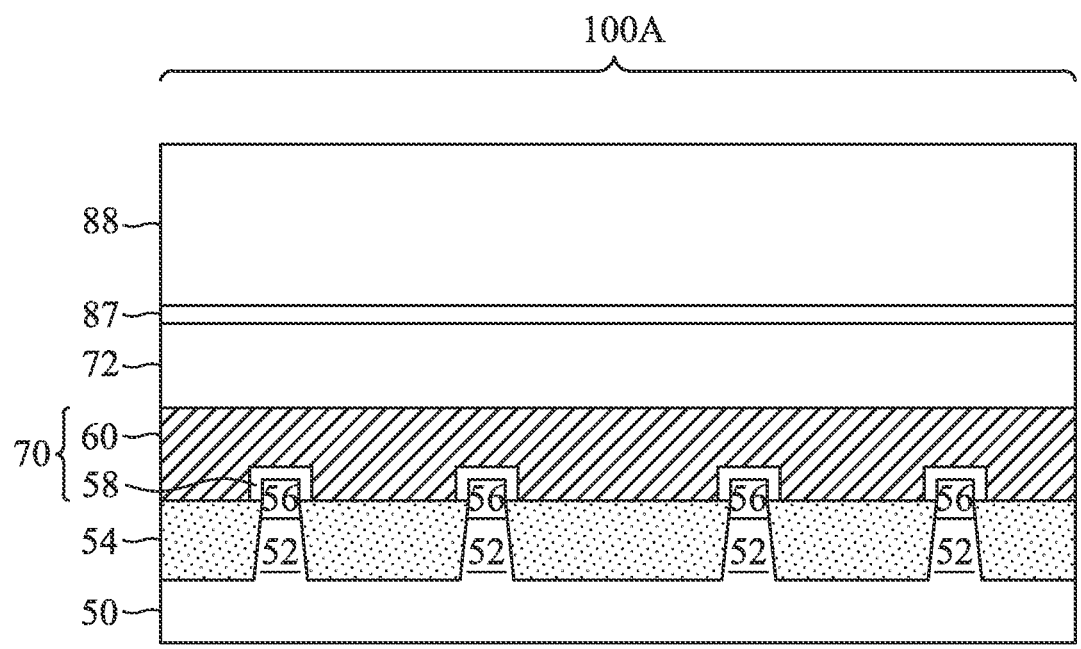
FIGS. 20A-C are cross-sectional views of the formation of a stressor material in the manufacture of a FinFET device in accordance with some embodiments.
Figure 20B:
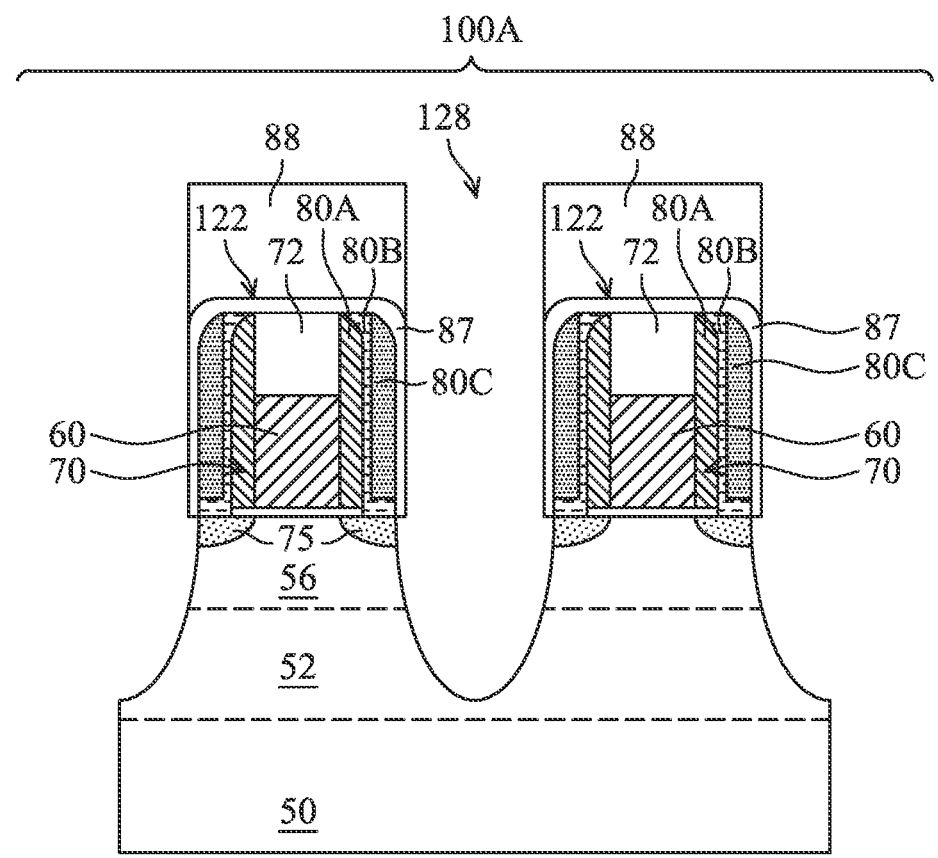
Figure 20C:
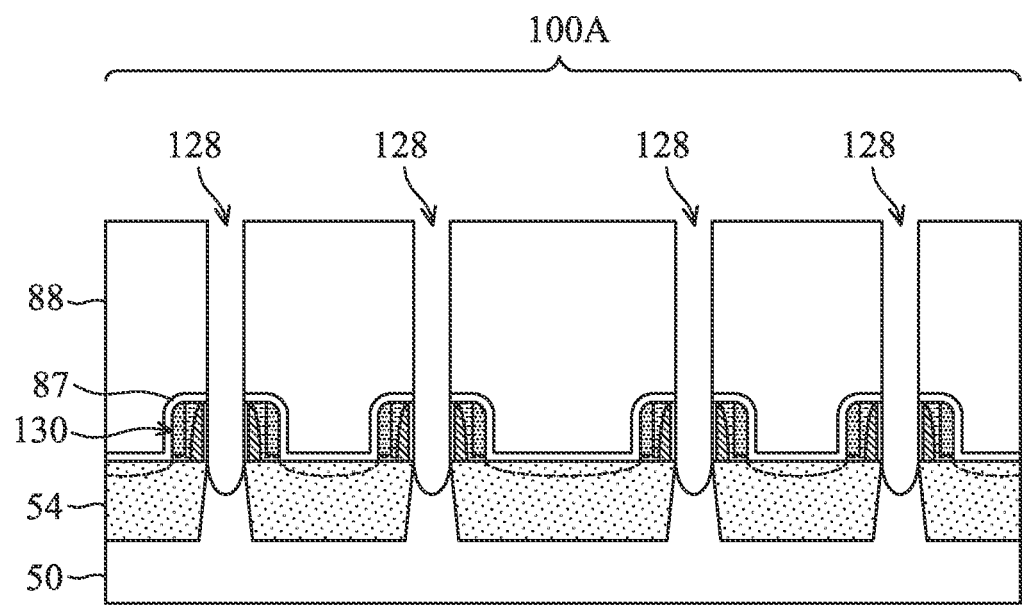

Referring to FIGS. 20A-C, openings are formed in the ILD 88, and some or all of the stressor material 98 exposed by the openings is removed. Removing the stressor material 98 exposes the recesses 128 adjacent the fins 56. In some cases, some of the stress provided by the stressor material 98 will remain within the fins 56 even after the stressor material 98 is removed. In some cases, the ILD 88 exposed by the mask 89 may be removed first, stopping on the etch stop layer 87. The ILD 88 may be removed using a suitable etching process, such as an anisotropic dry etching process. The stressor material 98 may then be removed using one or more suitable etching processes such as a dry etching process, a wet etching process, or a combination. In some cases, the etch stop layer 87 and the stressor material 98 are removed in the same etching process. By removing all of the stressor material 98 from the recesses 128, epitaxial source/drain regions 82 may then be grown within the recesses 128, described in greater detail below.

In some embodiments, portions of the stressor material 98 are left remaining within the openings 128, and the remaining portions of the stressor material 98 are removed in one or more subsequent steps. In some embodiments, the stressor material 98 may be completely removed from some of the openings 128, and some or all of the stressor material 98 in other openings 128 may be left remaining. In some cases, leaving remaining stressor material 98 to be removed later may reduce decay of the stress memory provided to the fins 56 adjacent the remaining stressor material 98. In some cases, some of the stressor material 98 may be left remaining to reduce the stress imparted onto adjacent fins 56. For example, by removing only a portion of the stressor material 98, the stress on adjacent fins 56 may be reduced from about 1.0 GPa to about 0.5 GPa. This is an example, and other amounts of stress may be present in other cases.

Figure 21A:
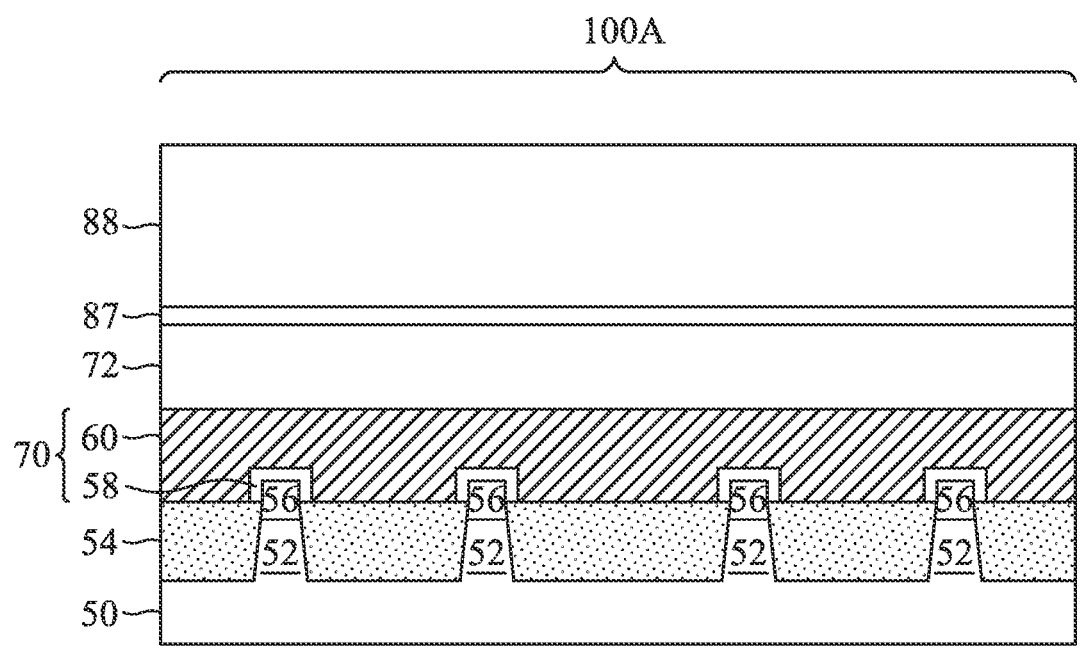
FIGS. 21A-C are cross-sectional views of the formation of a stressor material in the manufacture of a FinFET device in accordance with some embodiments.
Figure 21B:
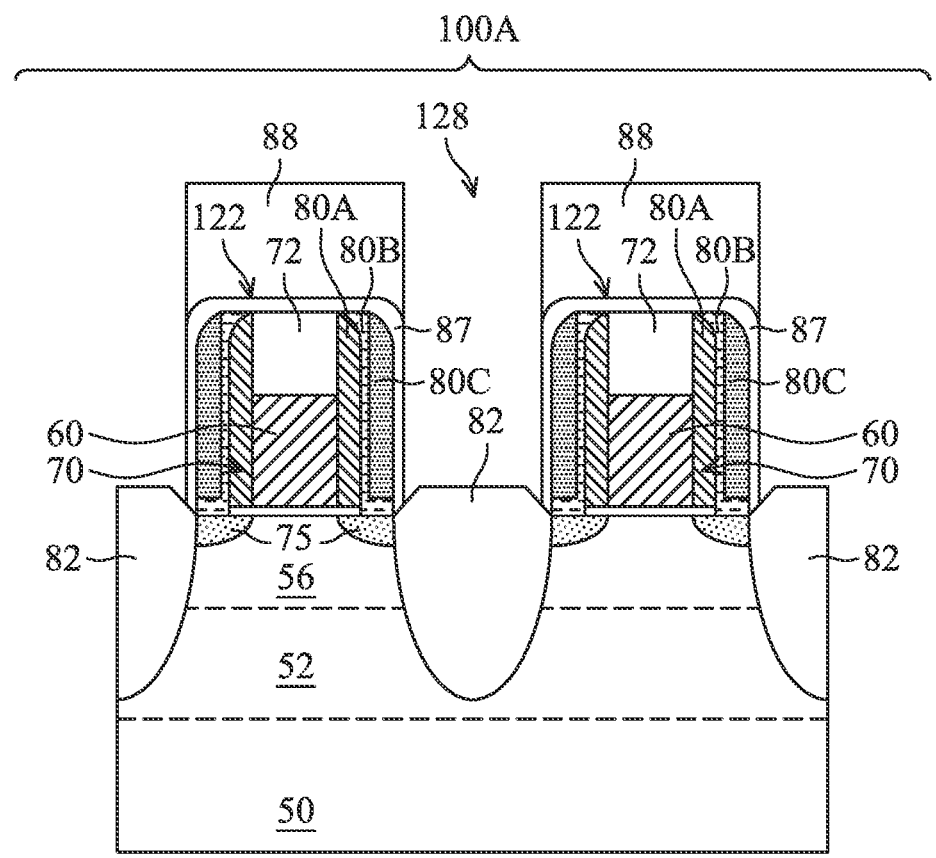
Figure 21C:
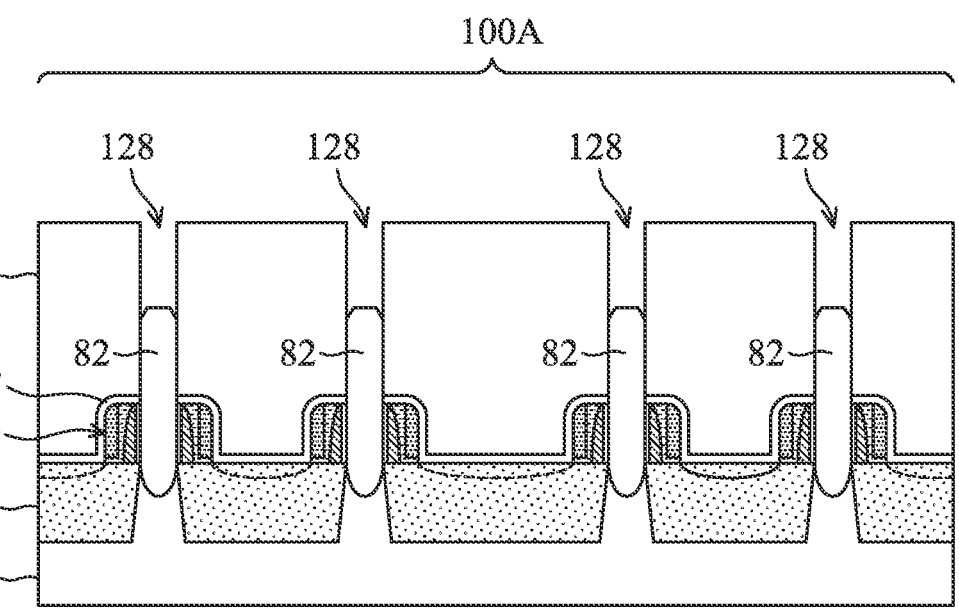

FIGS. 21A-C illustrate the formation of epitaxial source/drain regions 82 in the recesses 128 of the first region 100A. In some embodiments, the epitaxial source/drain regions 82 are epitaxially grown in the recesses 128 using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for N-type FinFETs. For example, if the fin 56 is silicon, the epitaxial source/drain regions 82 may include silicon, SiC, SiCP, SiP, a combination, or the like. The epitaxial source/drain regions 82 may have surfaces raised from respective surfaces of the fins 56 and may have facets. In some embodiments the epitaxial source/drain regions 82 may extend past the fins 56 and into the semiconductor strips 52. In some embodiments, the epitaxial source/drain regions 82 may extend above a top surface of the fins 56. In some cases, portions of the stressor material 98 may not be completely removed, and may remain in one or more recesses after formation of the epitaxial source/drain regions 82.

Epitaxial source/drain regions 82 are also formed in the recesses 128 of the second region 100B (not shown). In some embodiments, the epitaxial source/drain regions 82 are formed in the second region 100B using similar methods as the epitaxial source/drain regions 82 in the first region 100A. The epitaxial source/drain regions 82 in the second region 100B may be epitaxially grown in the recesses using MOCVD, MBE, LPE, VPE, SEG, a combination thereof, or the like. The epitaxial source/drain regions 82 in the second region 100B may include any acceptable material, such as any material that is appropriate for P-type FinFETs. For example, if the fin 56 is silicon, the epitaxial source/drain regions 82 may include SiGe, SiGeB, Ge, GeSn, a combination, or the like.

Figure 22A:
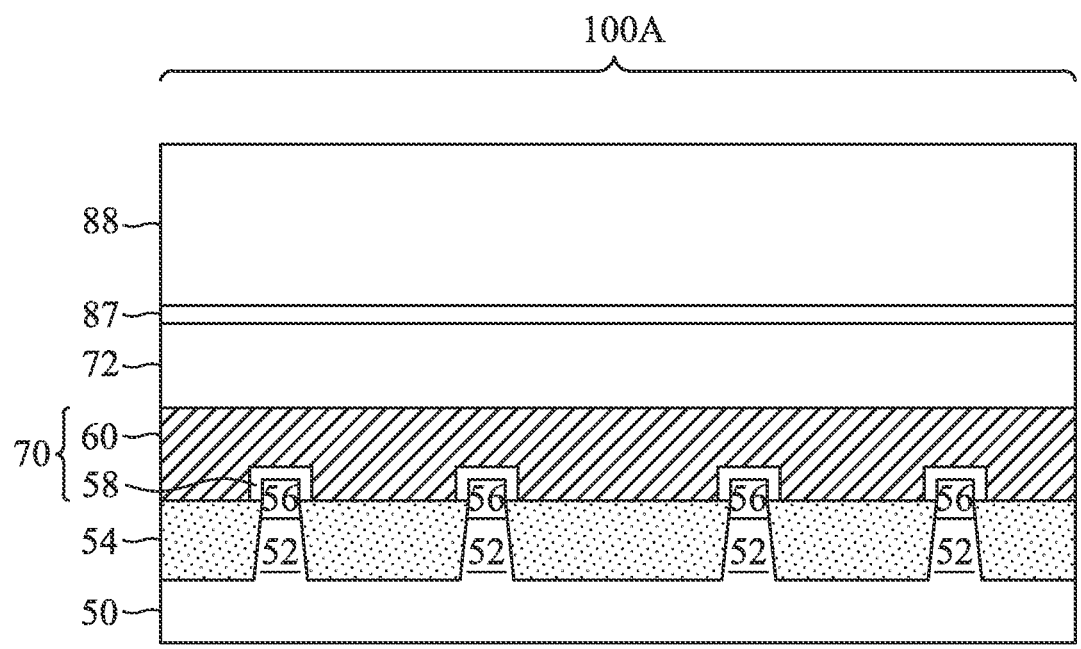
FIGS. 22A-C are cross-sectional views of the formation of a stressor material in the manufacture of a FinFET device in accordance with some embodiments.
Figure 22B:
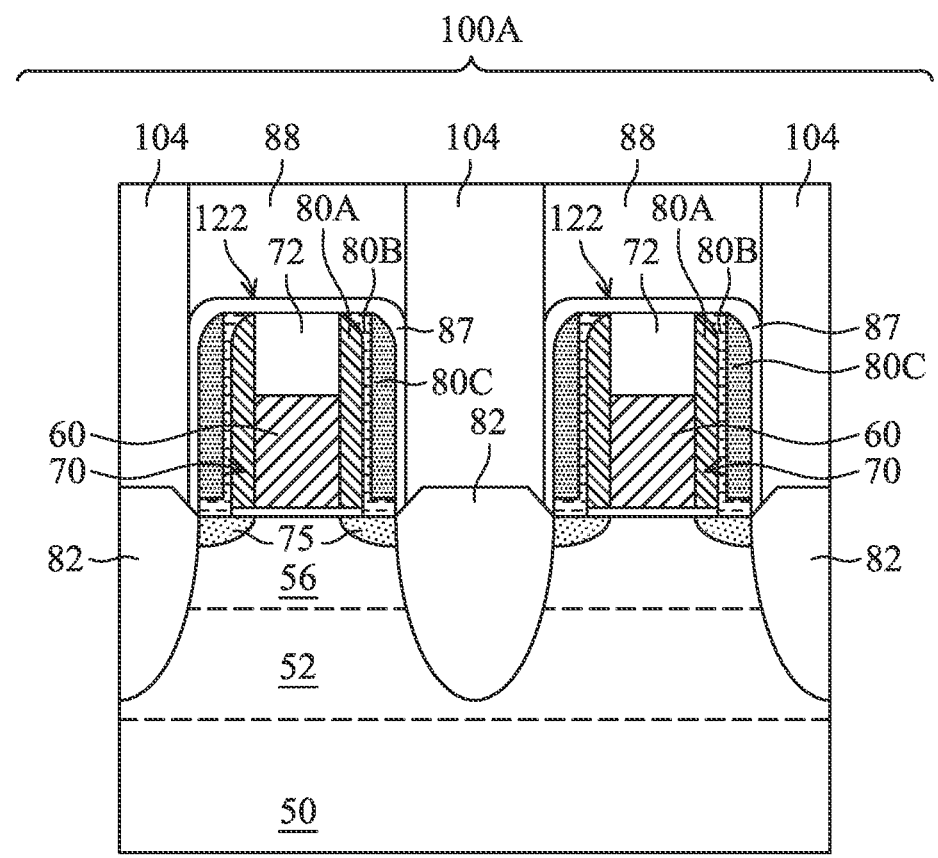
Figure 22C:
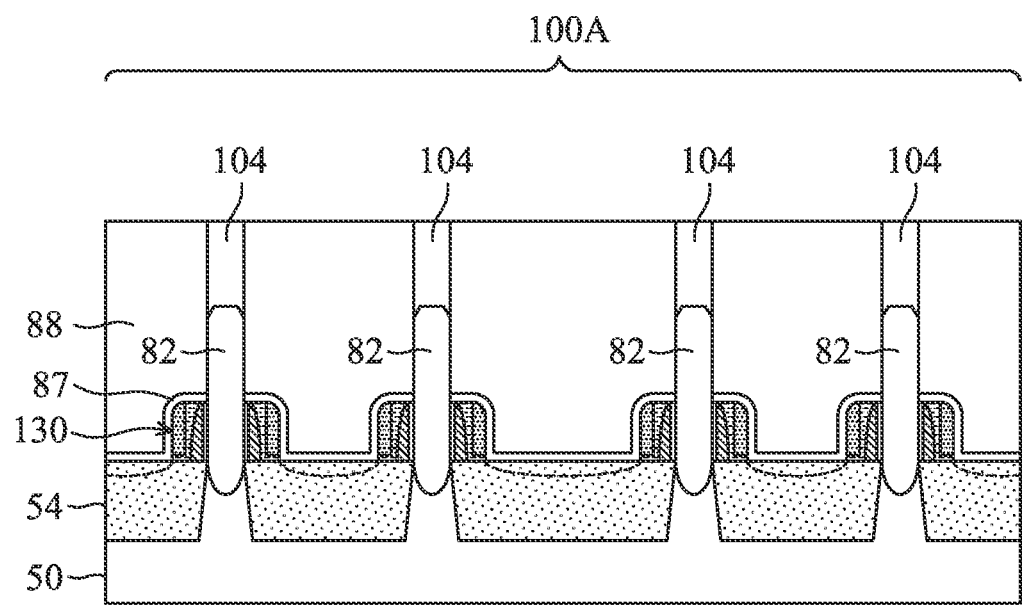

Referring to FIGS. 22A-C, contacts 104 to the epitaxial source/drain regions 82 are formed. In this exemplary embodiment, the contacts 104 are formed immediately after the epitaxial source/drain regions 82 are formed. However, in other embodiments, other processing steps are performed after the epitaxial source/drain regions 82 are formed and before the contacts 104 are formed. For example, in some embodiments, a contact etch stop layer (CESL) is formed over the epitaxial source/drain regions 82 prior to formation of the contacts 104. In other embodiments, the epitaxial source/drain regions 82 are recessed prior to formation of the contacts 104. In some embodiments, additional processing steps may include a CMP process, dummy gate replacement, gate contact formation, etc.

In some embodiments, a liner, such as a diffusion barrier layer, an adhesion layer, or the like, and a conductive material are formed in the openings in the ILD 88 and over the epitaxial source/drain regions 82, forming the contacts 104. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 88. The remaining liner and conductive material form contacts 104 in the openings. In some embodiments, a silicide (not shown) may be formed at the interface between the epitaxial source/drain regions 82 and the contacts 104 prior to deposition of a liner. The contacts 104 are physically and electrically coupled to the epitaxial source/drain regions 82.

Figure 23A:
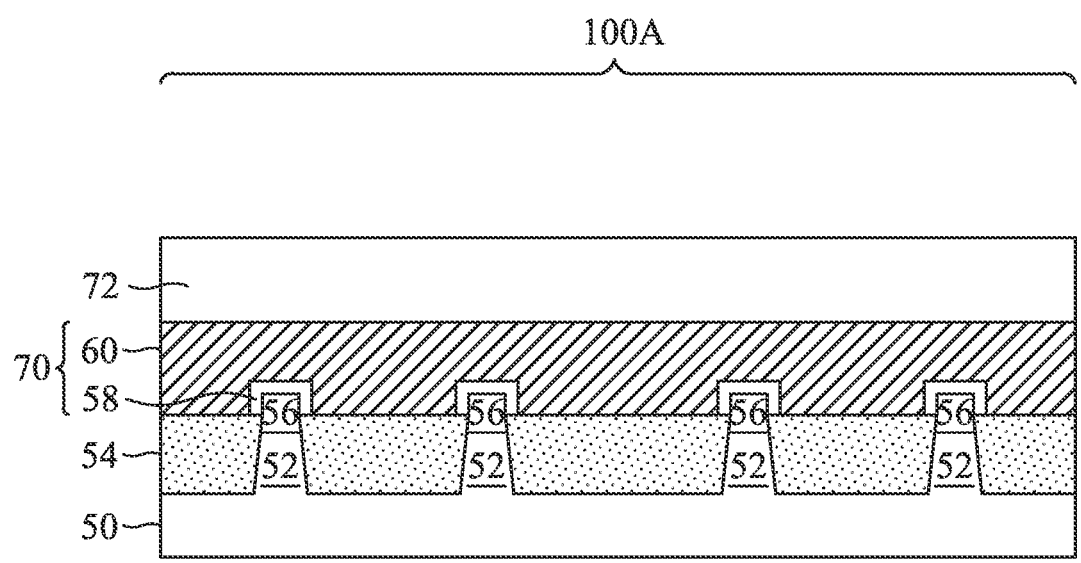
FIGS. 23A-C are cross-sectional views of the formation of a stressor material in the manufacture of a FinFET device in accordance with some embodiments.
Figure 23B:
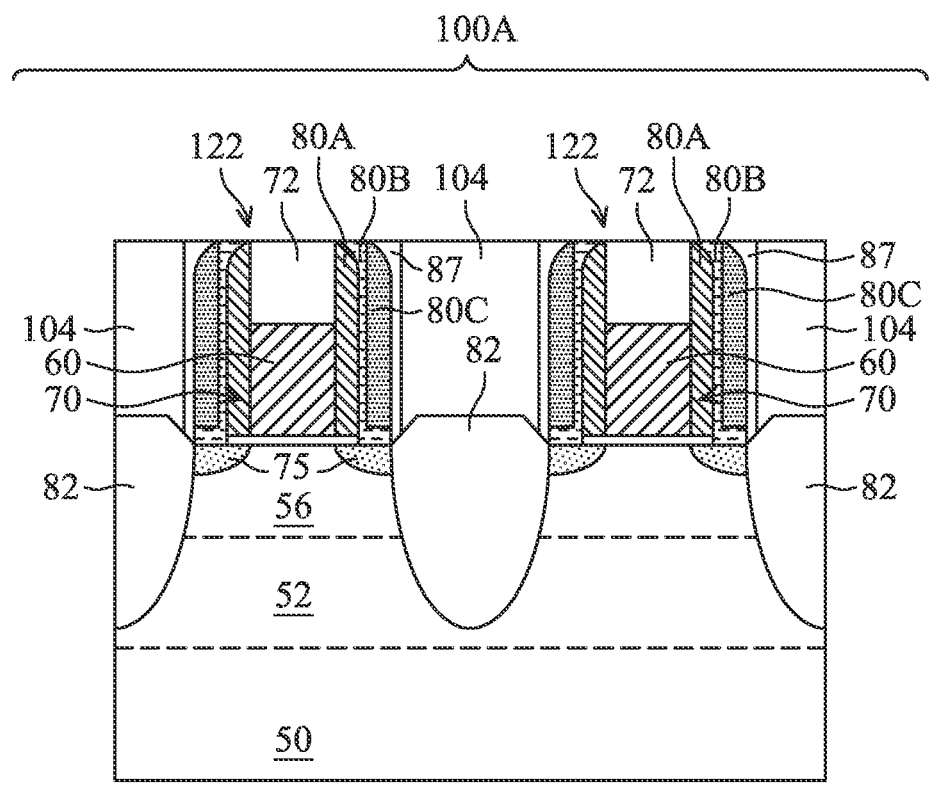
Figure 23C:
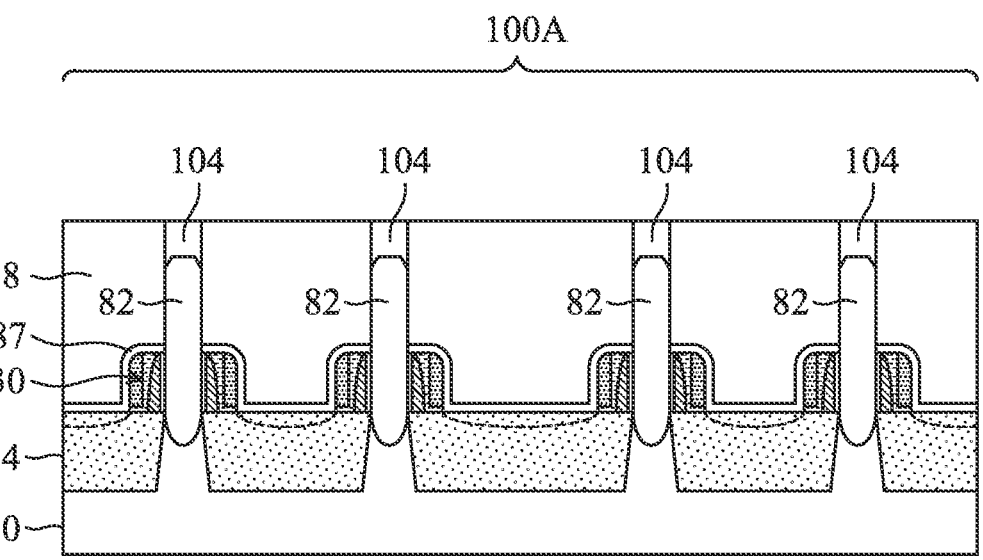

Referring to FIGS. 23A-C, a planarization process, such as a CMP, may be performed to level the top surfaces of the ILD 88 and the top surfaces of the contacts 104 with the top surfaces of the dummy gate stacks 70. After the planarization process, top surfaces of the dummy gate stacks 70 are exposed through the ILD 88. In some embodiments, the CMP may also remove the masks 72, or portions thereof, on the dummy gate stacks 70.

Figure 24A:
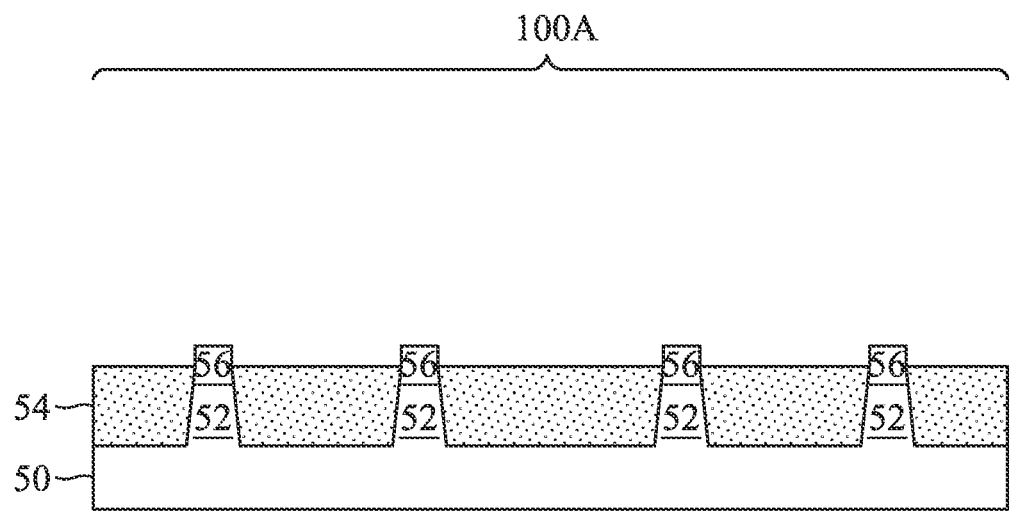
FIGS. 24A-C are cross-sectional views of the formation of a stressor material in the manufacture of a FinFET device in accordance with some embodiments.
Figure 24B:
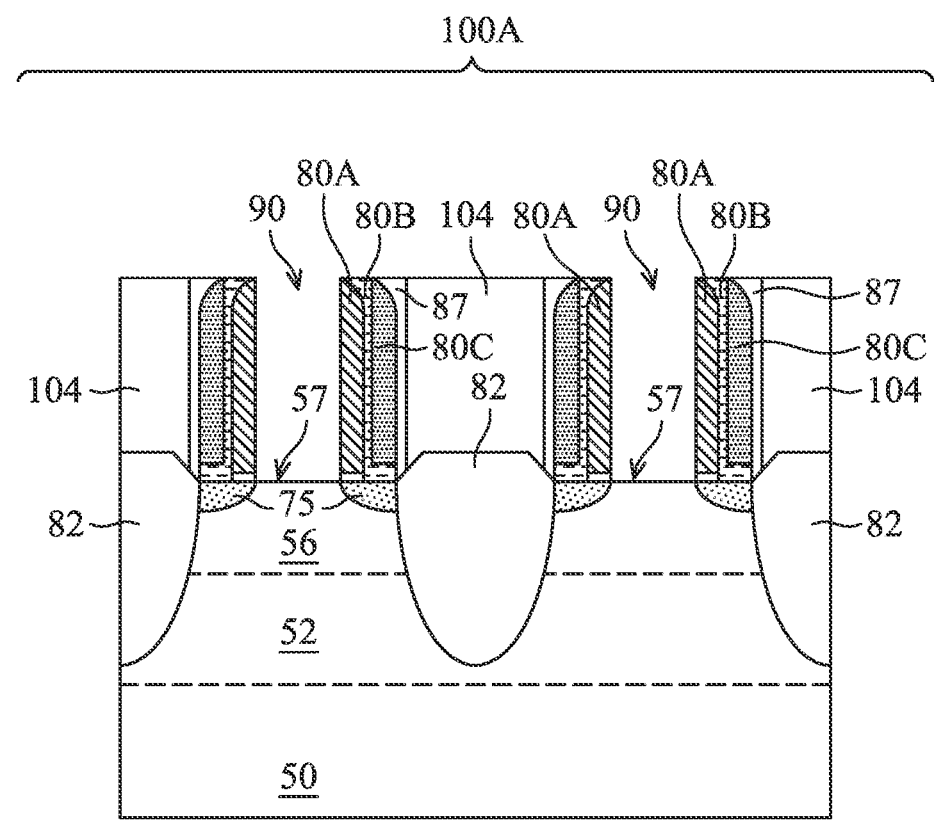
Figure 24C:
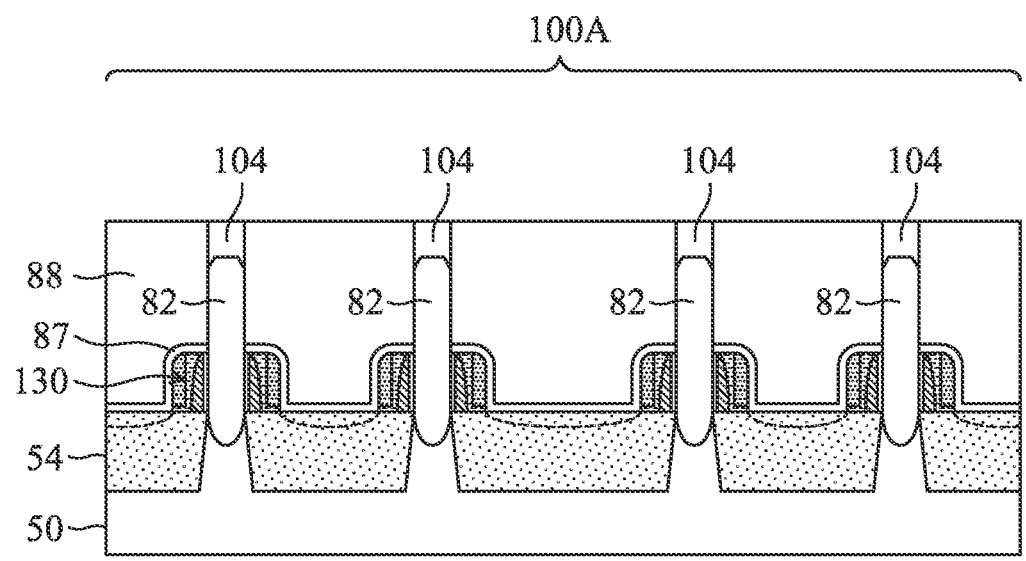

FIGS. 24A-25C describe the removal of dummy stacks 70 and formation of replacement gates 93 according to an embodiment. In other embodiments, the removal of dummy stacks 70 and formation of replacement gates 93 may be performed prior to formation of the epitaxial source/drain regions 82 and/or the contacts 104. Referring to FIGS. 24A-C, remaining portions of masks 72 and the dummy gate stacks 70 are removed in one or more etching steps, so that recesses 90 are formed. Each of the recesses 90 exposes the channel region 57 of a respective fin 56. Each channel region 57 is disposed between neighboring pairs of the epitaxial source/drain regions 82 in the first region 100A or between neighboring pairs of the epitaxial source/drain regions 82 in the second region 100B (not shown). During the removal, the dummy dielectric layer 58 may be used as an etch stop layer when the dummy gate stacks 70 are etched. The dummy dielectric layer 58 may then be removed after the removal of the dummy gate stacks 70.

Figure 25A:
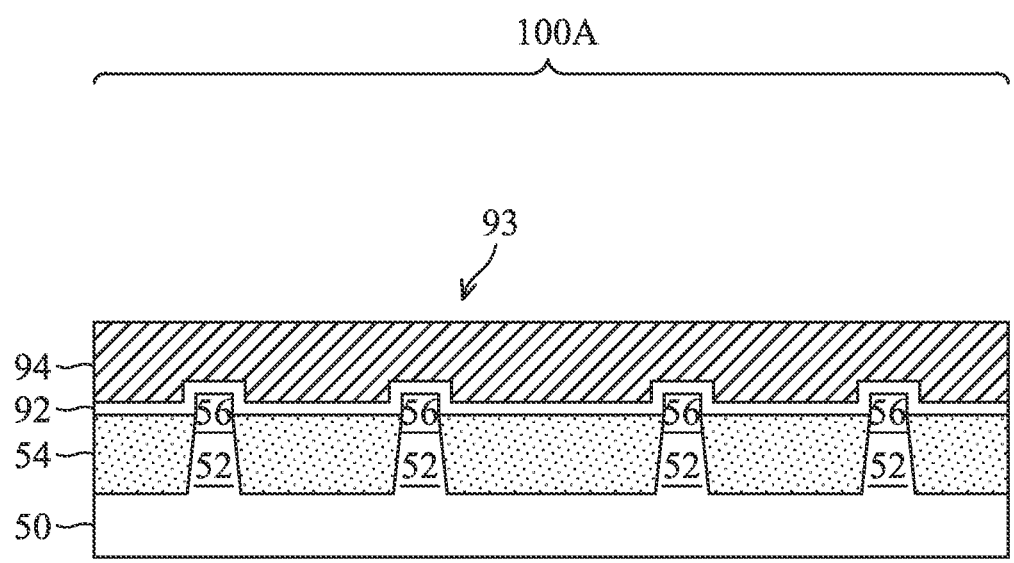
FIGS. 25A-C are cross-sectional views of the formation of a stressor material in the manufacture of a FinFET device in accordance with some embodiments.
Figure 25B:
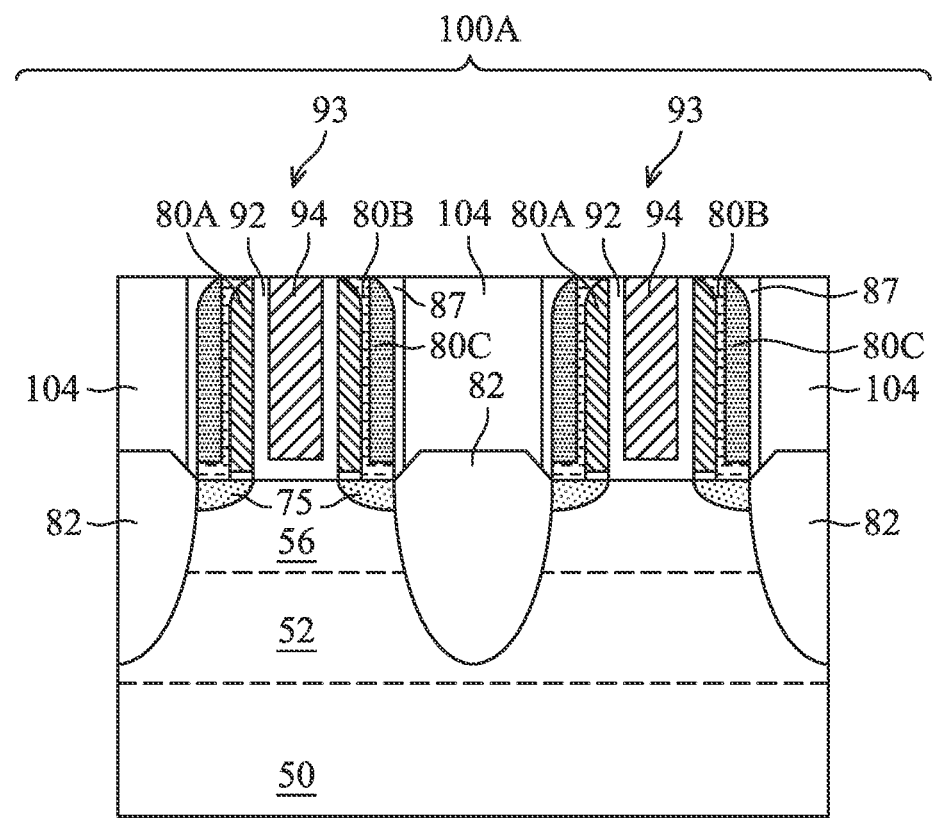
Figure 25C:
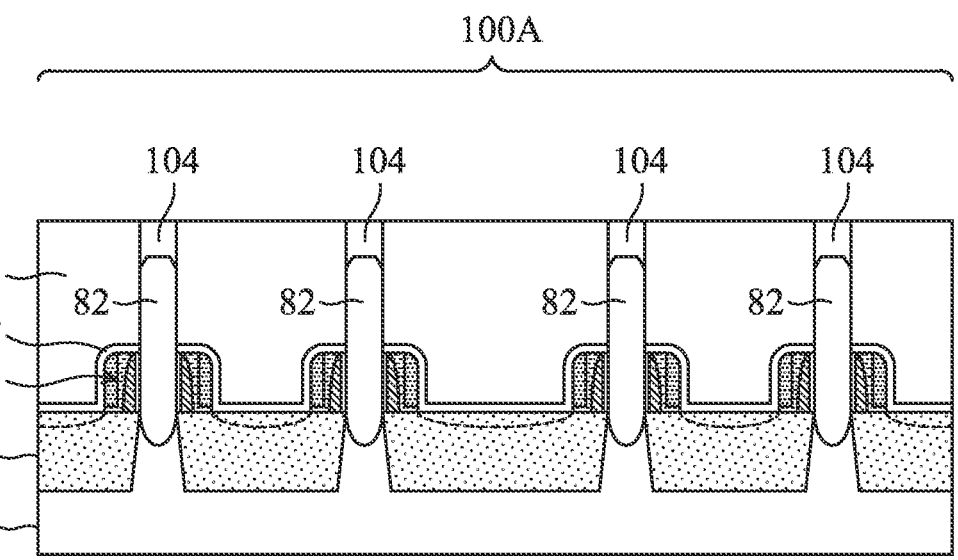

Referring to FIGS. 25A-C, gate dielectric layer 92 and gate fill 94 are formed for replacement gates 93 in the first region 100A and the second region 100B. The gate dielectric layers 92 are deposited conformally in the recesses 90, such as on the top surfaces and the sidewalls of the fins 56, on sidewalls of the gate spacers 122 and fin spacers 130, respectively, and on a top surface of the ILD 88. In some embodiments, the gate dielectric layer 92 includes silicon oxide, silicon nitride, or multi-layers thereof. In other embodiments, the gate dielectric layer 92 includes a high-k dielectric material, and in these embodiments, the gate dielectric layer 92 may have a k value greater than about 7.0, and may include a metal oxide or a silicate of Hf, Al, Zr, La, Mg, Ba, Ti, Pb, or combinations thereof. The formation methods of the gate dielectric layer 92 may include Molecular-Beam Deposition (MBD), ALD, PECVD, a combination thereof, or the like.

Next, the gate fill 94 is deposited over the gate dielectric layer 92. The gate fill 94 may fill the remaining portions of the recesses 90. The gate fill 94 may be made of a metal-containing material such as TiN, TaN, TaC, Co, Ru, Al, Ag, Au, W, Ni, Ti, Cu, combinations thereof, or multi-layers thereof. For example, although a single material of the gate fill 94 is illustrated, any number of work function layers may also be deposited in the recesses 90. After formation of the gate fill 94, a planarization process, such as a CMP, may be performed to remove the excess portions of the gate dielectric layer 92 and gate fill 94, which excess portions may be over the top surface of ILD 88. The resulting remaining portions of material of the gate dielectric layer 92 and gate fill 94 thus form replacement gates 93 of the resulting FinFETs.

In some embodiments, the formation of the gate dielectric layers 92 of first region 100A and of second region 100B may occur simultaneously such that the respective gate dielectric layers 92 are made of the same materials, and the formation of the gate fill 94 may occur simultaneously such that the respective gate fill 94 in first region 100A and second region 100B are made of the same materials. However, in other embodiments, the respective gate dielectric layers 92 in first region 100A and second region 100B may be formed by distinct processes, such that the respective gate dielectric layers 92 in first region 100A and second region 100B may be made of different materials. The respective gate fill 94 in first region 100A and second region 100B may be formed by distinct processes, such that the respective gate fill 94 in first region 100A and second region 100B may be made of different materials. Various masking steps may be used to mask and expose appropriate regions when using distinct processes.

Figure 26A:
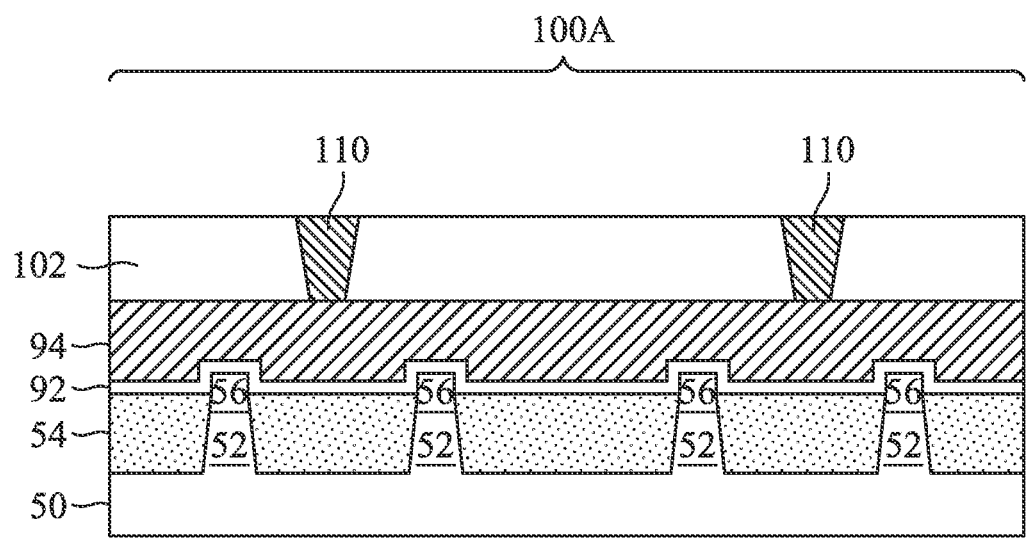
FIGS. 26A-C are cross-sectional views of the formation of a stressor material in the manufacture of a FinFET device in accordance with some embodiments.
Figure 26B:
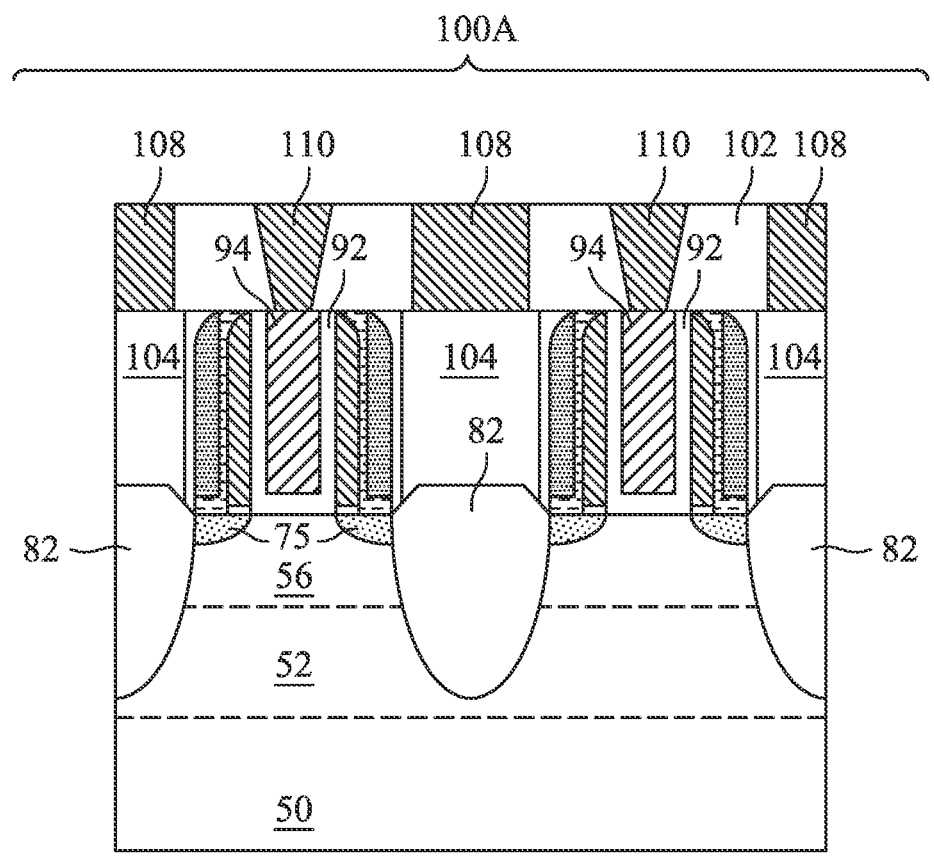
Figure 26C:
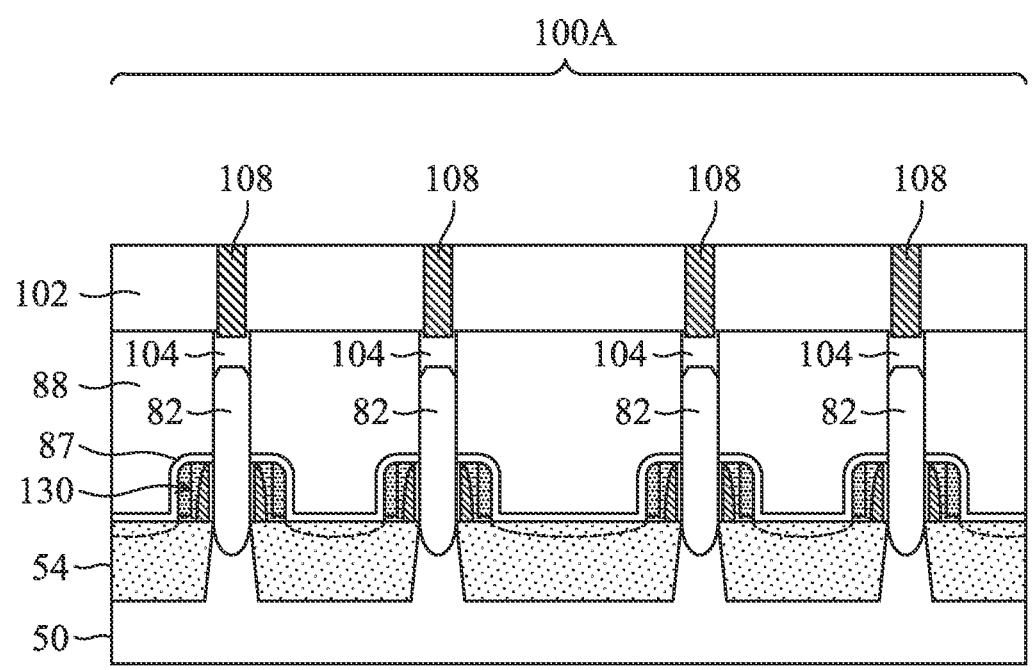

Referring to FIGS. 26A-C, an ILD 102 is deposited over the ILD 88. Contacts 108 are formed through the ILD 102 and the ILD 88 to connect to the contacts 104 and the epitaxial source/drain regions 82. Contacts 110 are also formed through the ILD 102 to connect to the replacement gates 93. In an embodiment, the ILD 102 is formed using similar materials and methods as ILD 88, described above with reference to FIGS. 18A-C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 108 and the contacts 110 are formed through the ILD 102. These openings may all be formed simultaneously in a same process, or in separate processes. The openings may be formed using acceptable photolithography and etching techniques. A conductive material is then formed in the openings. In some embodiments, a liner is formed prior to the conductive material. The conductive material may be copper, a copper alloy, silver, gold, tungsten, aluminum, nickel, or the like. A planarization process, such as a CMP, may be performed to remove excess materials from a top surface of the ILD 102. The contacts 108 are electrically coupled to the epitaxial source/drain regions 82, and the contacts 110 are physically and electrically coupled to the replacement gates 93. While the contacts 108 are depicted in FIG. 26B in a same cross-section as the contacts 110, this depiction is for purposes of illustration, and in some embodiments the contacts 108 are disposed in different cross-sections from contacts 110.

Figure 27:
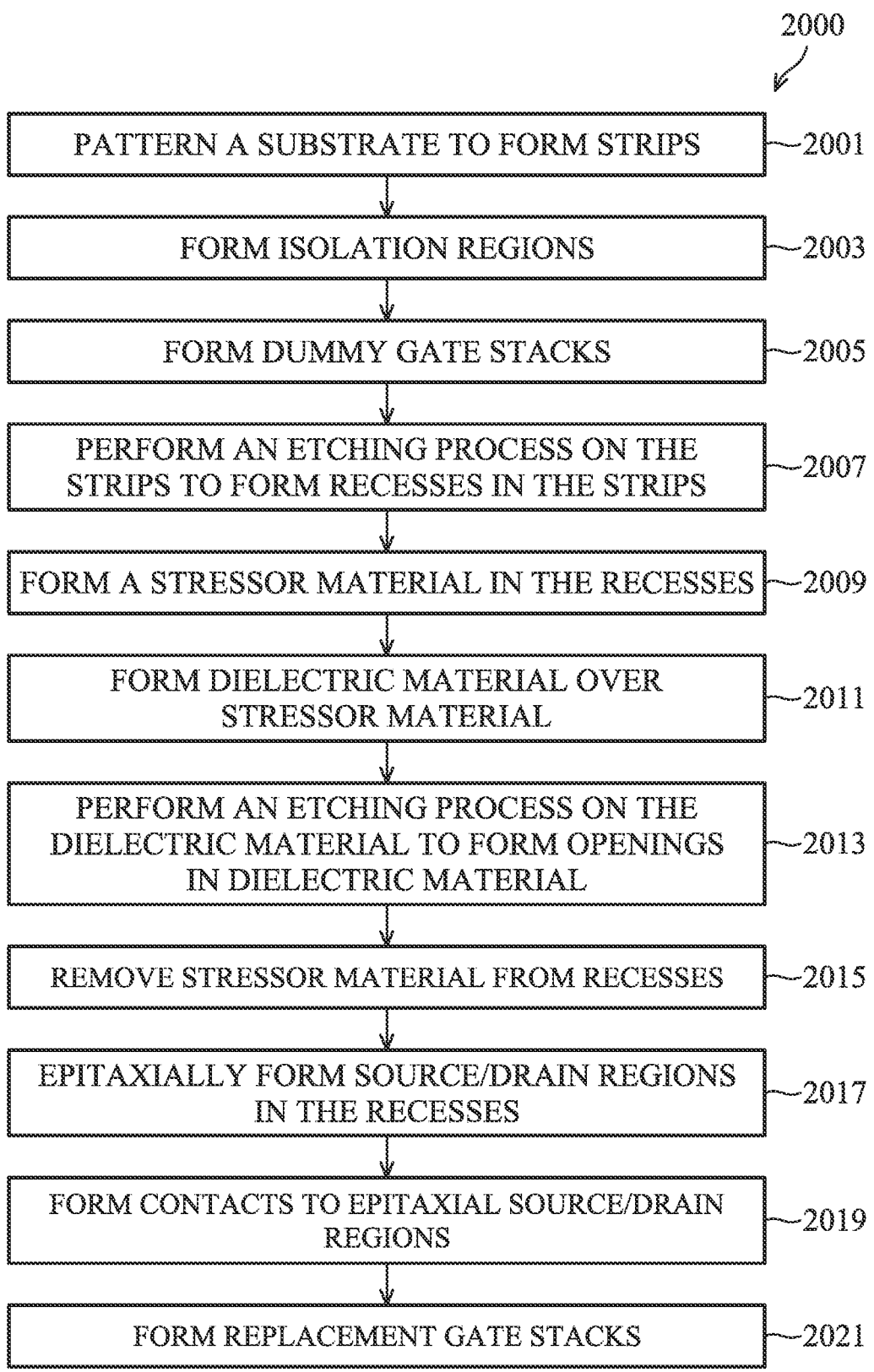
FIG. 27 is a flow diagram illustrating a method of forming a FinFET device in accordance with some embodiments.

FIG. 27 is a flow diagram illustrating a method 2000 of forming a FinFET device in accordance with some embodiments. The method 2000 starts with step 2001, where a substrate (such as the substrate 50 illustrated in FIG. 2) is patterned to form strips (such as the semiconductor strips 52 illustrated in FIG. 3) as described above with reference to FIGS. 2 and 3. In step 2003, isolation regions (such as the isolation regions 54 illustrated in FIG. 5) are formed between adjacent strips as described above with reference to FIGS. 4 and 5. In step 2005, dummy gate stacks (such as the dummy gate stacks 70 illustrated in FIGS. 7A-B) are formed over the strips as described above with reference to FIGS. 6A-B, and 7A-C. In step 2007, an etching process is performed on the strips to form recesses (such as the recesses 128 illustrated in FIG. 12B) in the strips as described above with reference to FIG. 12A-C. In step 2009, a stressor material (such as the stressor material 98 illustrated in FIGS. 14A-C) is formed in the recesses as described above with reference to FIG. 14A-C. In step 2011, a dielectric material (such as the ILD 88 illustrated in FIGS. 18A-C) is formed over the stressor material as described above with reference to FIG. 18A-C. In step 2013, an etching process is performed on the dielectric material to form openings (such as the openings in the ILD 88 illustrated in FIGS. 20B-C) in the dielectric material as described above with reference to FIGS. 20A-C. In step 2015, the stressor material is removed from the recesses (such as the recesses 128 illustrated in FIGS. 20B-C) in the strips as described above with reference to FIGS. 20A-C. In some embodiments, step 2015 may be performed in multiple separate steps, and other steps may be performed between each of the multiple separate steps. In step 2017, source/drain regions (such as the epitaxial source/drain regions 82 illustrated in FIGS. 21B-C) are epitaxially grown in the openings as described above with reference to FIGS. 21A-C. In step 2019, contacts (such as the contacts 104 illustrated in FIGS. 22B-C) are formed over the epitaxial source/drain regions as described above with reference to FIGS. 22A-C. In step 2021, replacement gate stacks (such as the replacement gates 93 illustrated in FIGS. 25A-B) are formed over the strips as described above with reference to FIGS. 24A-25C. In some embodiments, other steps may be performed between each of steps 2013-2019. For example, steps 2013-2019 may be performed after step 2021. This method 2000 is an illustrative embodiment, and other process steps or different process steps than those described are within the scope of this disclosure.

Various embodiments discussed herein allow for improved FinFET performance. The techniques herein allow for improved mobility in FinFET devices due to stress. For example, by forming the stressor material on sidewalls of the fins, more stress can be provided to the fins, which can further increase mobility in the fins. In some cases, the amount of stress provided to the fins may be greater than 2.5 GPa. Additionally, the stressor material can remain on the fins over several subsequent process steps before being removed, which can enhance the stress memory effect and reduce the amount of stress decay after removal of the stressor material. The techniques described herein allow for different types of stress to be provided to the fins. Additionally, the amount of stress and the profile of stresses on a fin can be controlled by controlling the formation properties of the stressor material, controlling the annealing of the stressor material, controlling how much stressor material is removed over one or more removal steps, or through the use of multiple layers of stressor materials. The techniques described herein allow for process flexibility, as the removal of the stressor material and subsequent formation of the epitaxial source/drain regions and contacts may be performed at different process steps depending on the application. For example, after formation of the stressor material, the stressor material may be removed after any subsequent process step. Different amounts of stress may be provided to different sets of fins by, for example, forming stressor materials with different properties in different regions or removing different amounts of stressor material in different regions.

In an embodiment, a method includes forming a fin over a substrate, forming a dummy gate structure over the fin, removing a portion of the fin adjacent the dummy gate structure to form a first recess, depositing a stressor material in the first recess, removing at least a portion of the stressor material from the first recess, and after removing the at least a portion of the stressor material, epitaxially growing a source/drain region in the first recess. In an embodiment, the method further includes performing an anneal process on the stressor material. In an embodiment, depositing a stressor material in the first recess includes depositing a first stressor material in the first recess, after depositing the first stressor material, performing a first annealing process, depositing a second stressor material over the first stressor material, and after depositing the second stressor material, performing a second annealing process. In an embodiment, the removing the at least a portion of the stressor material from the first recess includes removing a first portion of the stressor material using a first etching process and removing a second portion of the stressor material using a second etching process. In an embodiment, the method further includes forming a dielectric layer over the stressor material and forming an opening in the dielectric layer, wherein the source/drain region is epitaxially grown through the opening in the dielectric layer. In an embodiment, the method further includes forming a contact to the source/drain region through the opening in the dielectric layer. In an embodiment, the stressor material provides an amount of tensile stress on the fin an between about 2.5 GPa and about 4.0 GPa. In an embodiment, the method further includes forming a buffer layer in the first recess prior to depositing the stressor material.

In an embodiment, a method includes patterning a substrate to form a strip, the strip including a first semiconductor material, forming an isolation region along a sidewall of the strip, an upper portion of the strip extending above a top surface of the isolation region, forming a dummy gate structure along sidewalls and along a first top surface of the upper portion of the strip, performing a first etching process on the strip, wherein the first etching process forms a first recess in the strip adjacent to the dummy gate structure, forming a first dielectric material within the first recess, performing an anneal process on the first dielectric material, the first dielectric material providing a stress to the sidewalls of the first recess after the anneal process, removing the first dielectric material from the first recess, and epitaxially growing a source/drain region in the first recess. In an embodiment, the first dielectric material provides tensile stress. In an embodiment, the method further includes forming a second dielectric material over the first dielectric material and over the dummy gate structure. In an embodiment, the first dielectric material includes SiN. In an embodiment, the first dielectric material is formed at a process temperature between about 300° C. and about 350° C. In an embodiment, the anneal process includes a process temperature between about 800° C. and about 1000° C. In an embodiment, the method further includes forming an oxide layer within the first recess, wherein the first dielectric material is formed over the oxide layer. In an embodiment, a portion of the first dielectric material remains in the first recess after epitaxially growing a source/drain region in the first recess.

In an embodiment, a semiconductor device includes a first semiconductor fin over a substrate, the first semiconductor fin including a channel region and a recess adjacent the channel region, a gate stack overlying a channel region of the first semiconductor fin, wherein the channel region of the first semiconductor fin has a stress between about 2.5 GPa and about 4.0 GPa, and an epitaxial region disposed within the recess. In an embodiment, a region of the first semiconductor fin located below the channel region has a stress between about 2.5 GPa and about 4.0 GPa. In an embodiment, the stress is a tensile stress. In an embodiment, the first semiconductor fin has a lattice distortion that extends a vertical distance between about 50% and about 90% of the vertical depth of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a semiconductor structure over a substrate;
    forming a dummy gate structure over the semiconductor structure;
    removing a portion of the semiconductor structure adjacent the dummy gate structure to form a first recess;
    forming a stressor material in the first recess, wherein the stressor material comprises a dielectric material;
    forming one or more dielectric layers over the stressor material;
    after forming the one or more dielectric layers, etching the one or more dielectric layers and at least a portion of the stressor material, wherein the etching exposes a sidewall of the semiconductor structure in the first recess; and
    after etching the stressor material, epitaxially growing a source/drain region in the first recess.

2. The method of claim 1, wherein forming the stressor material comprises:
    depositing a first dielectric stress layer in the first recess; and
    depositing a second dielectric stress layer over the first dielectric stress layer.

3. The method of claim 2, wherein forming the stressor material further comprises:
    after depositing the first dielectric stress layer and prior to depositing the second dielectric stress layer, annealing the first dielectric stress layer.

4. The method of claim 2, wherein forming the stressor material further comprises:
    after depositing the second dielectric stress layer, annealing the second dielectric stress layer.

5. The method of claim 2, wherein depositing the first dielectric stress layer comprises depositing a first material using a first set of process parameters, wherein depositing the second dielectric stress layer comprises depositing the first material using a second set of process parameters, wherein the first set of process parameters is different than the second set of process parameters.

6. The method of claim 5, wherein the first material comprises silicon nitride.

7. The method of claim 1, wherein the one or more dielectric layers comprise an etch stop layer and an interlayer dielectric layer over the etch stop layer.

8. The method of claim 7, wherein etching the one or more dielectric layers removes the interlayer dielectric layer from the etch stop layer along a sidewall of the dummy gate structure.

9. A method comprising:
    patterning a substrate to form a strip, the strip comprising a first semiconductor material;
    forming an isolation region along a sidewall of the strip, an upper portion of the strip extending above a top surface of the isolation region;
    forming a gate structure along sidewalls and along a first top surface of the upper portion of the strip;
    performing a first etching process on the strip to form a first recess in the strip adjacent to the gate structure;

forming a first dielectric material within the first recess, the first dielectric material exerting a stress to a channel region in the strip;

removing the first dielectric material from the first recess using multiple separate etch processes; and epitaxially growing a source/drain region in the first recess.

10. The method of claim 9, wherein the gate structure is a dummy gate structure, and further comprising after forming the source/drain region, replacing the dummy gate structure with a replacement gate structure.

11. The method of claim 9, wherein forming the first dielectric material comprises:

depositing a dielectric material; and annealing the dielectric material.

12. The method of claim 9, wherein forming the first dielectric material comprises depositing the first dielectric material within the first recess and over the gate structure, further comprising, prior to epitaxially growing the source/drain region, forming one or more dielectric layers over the gate structure and at least a portion of the first dielectric material, wherein removing the first dielectric material comprises:

prior to forming the one or more dielectric layers, performing a first etch process to remove the first dielectric material from over the gate structure; and after forming the one or more dielectric layers, performing a second etch process to remove the first dielectric material from the first recess.

13. The method of claim 9, wherein forming the first dielectric material comprises:

depositing a plurality of layers of the first dielectric material; and performing at least a first anneal after depositing a first layer of the plurality of layers and prior to depositing a final layer of the plurality of layers.

14. The method of claim 13, wherein forming the first dielectric material further comprises performing a second anneal after depositing the final layer of the plurality of layers.

15. The method of claim 13, wherein depositing the first layer of the plurality of layers uses different process conditions than depositing the final layer of the plurality of layers.

16. A method comprising:

forming a first dummy gate structure over a semiconductor structure, the semiconductor structure protruding above an isolation region on a substrate;

forming a first recess in the semiconductor structure adjacent the first dummy gate structure;

forming a dielectric stressor material in the first recess;

forming a dielectric layer over the dielectric stressor material;

forming an opening in the dielectric layer, the opening exposing exposed portions of the dielectric stressor material;

after forming the opening, removing the exposed portions of the dielectric stressor material to expose a channel region; and after removing the exposed portions of the dielectric stressor material, epitaxially growing a source/drain material in the first recess.

17. The method of claim 16, further comprising forming a buffer layer, wherein the dielectric stressor material is formed over the buffer layer.

18. The method of claim 17, further comprising after removing the exposed portions of the dielectric stressor material, removing at least a portion of the buffer layer.

19. The method of claim 16, wherein forming the dielectric stressor material comprises forming a plurality of dielectric layers and performing a plurality of anneals.

20. The method of claim 16, wherein a portion of the dielectric stressor material remains in the first recess after epitaxially growing the source/drain material in the first recess.

* * * * *